United States Patent
Nam et al.

(10) Patent No.: US 7,683,304 B2
(45) Date of Patent: Mar. 23, 2010

(54) CMOS IMAGE SENSOR AND RELATED METHOD OF OPERATION

(75) Inventors: Jung-hyun Nam, Suwon-si (KR); Jae-seob Rho, Anyang-si (KR)

(73) Assignee: Samsumg Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/865,865

(22) Filed: Oct. 2, 2007

(65) Prior Publication Data

US 2008/0042047 A1 Feb. 21, 2008

Related U.S. Application Data

(62) Division of application No. 11/267,312, filed on Nov. 7, 2005.

(30) Foreign Application Priority Data

Nov. 8, 2004 (KR) ............. 10-2004-0090364
Feb. 24, 2005 (KR) ............. 10-2005-0015544

(51) Int. Cl.
*H01L 27/00* (2006.01)
(52) U.S. Cl. .................... 250/208.1; 250/214 DC; 250/214 R; 348/302; 348/308
(58) Field of Classification Search ......... 250/208.1, 250/214 DC, 214 R, 214 SW; 348/294, 297, 348/300, 301, 302, 307, 308, 310
See application file for complete search history.

(56) References Cited

U.S. PATENT DOCUMENTS

| | | | |
|---|---|---|---|
| 5,777,317 A * | 7/1998 | Maki ................. | 250/208.1 |
| 6,320,616 B1 | 11/2001 | Sauer | |
| 6,410,899 B1 | 6/2002 | Merrill et al. | |
| 6,768,093 B2 | 7/2004 | Miida | |
| 2002/0036700 A1 | 3/2002 | Merrill | |
| 2004/0130383 A1 | 7/2004 | Du et al. | |
| 2005/0219876 A1 * | 10/2005 | Yan ................. | 363/59 |
| 2006/0023096 A1 * | 2/2006 | Watanabe ............ | 348/302 |
| 2006/0138489 A1 * | 6/2006 | Ahn et al. ............ | 257/292 |
| 2006/0157761 A1 * | 7/2006 | Park et al. ........... | 257/293 |

FOREIGN PATENT DOCUMENTS

| | | |
|---|---|---|
| CN | 1304178 A | 7/2001 |
| JP | 1126740 | 1/1999 |
| JP | 2003169256 | 6/2003 |
| JP | 2004265939 | 9/2004 |
| KR | 1020040090364 | 4/2001 |

* cited by examiner

*Primary Examiner*—Thanh X Luu
*Assistant Examiner*—Francis M Legasse, Jr.
(74) *Attorney, Agent, or Firm*—Volentine & Whitt, PLLC

(57) ABSTRACT

Provided is a complementary metal oxide semiconductor (CMOS) image sensor. The CMOS image sensor includes a pixel array unit having a matrix-type array of unit pixels, each unit pixel including a charge transfer element transferring charge collected in a photoelectric conversion element to a charge detection element. The charge transfer element also receives a boosted voltage signal higher than an external power voltage.

17 Claims, 25 Drawing Sheets

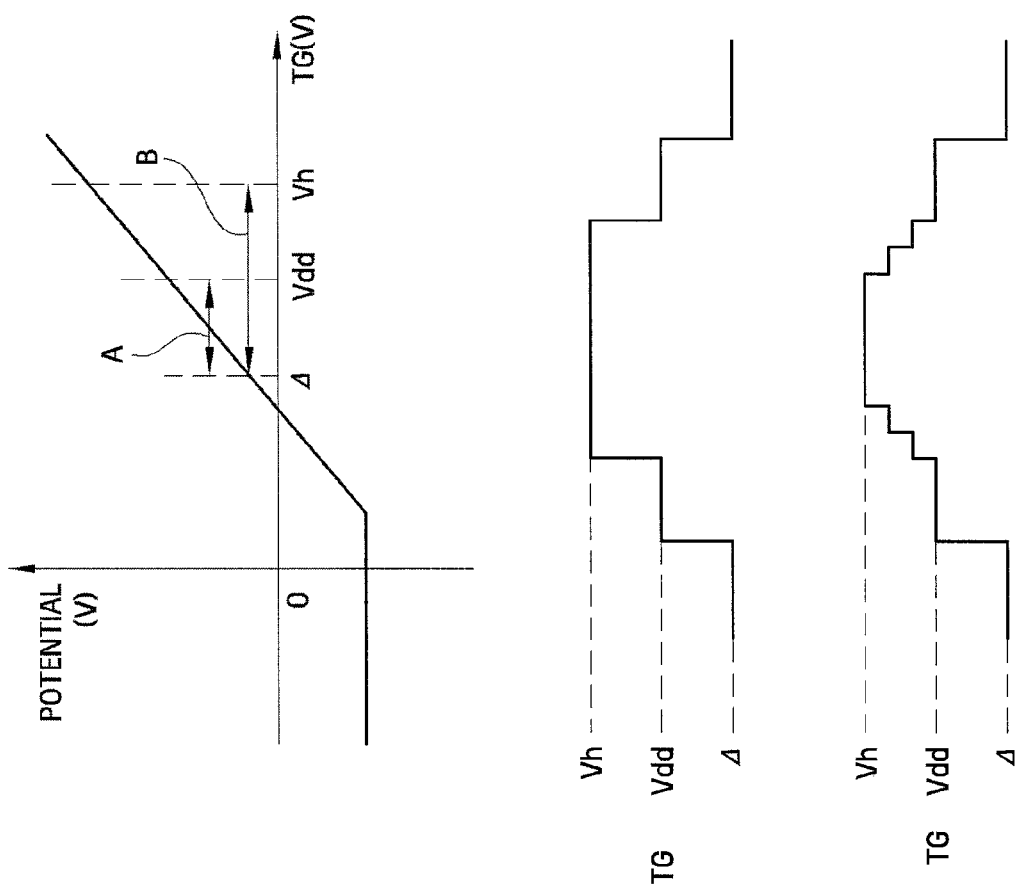

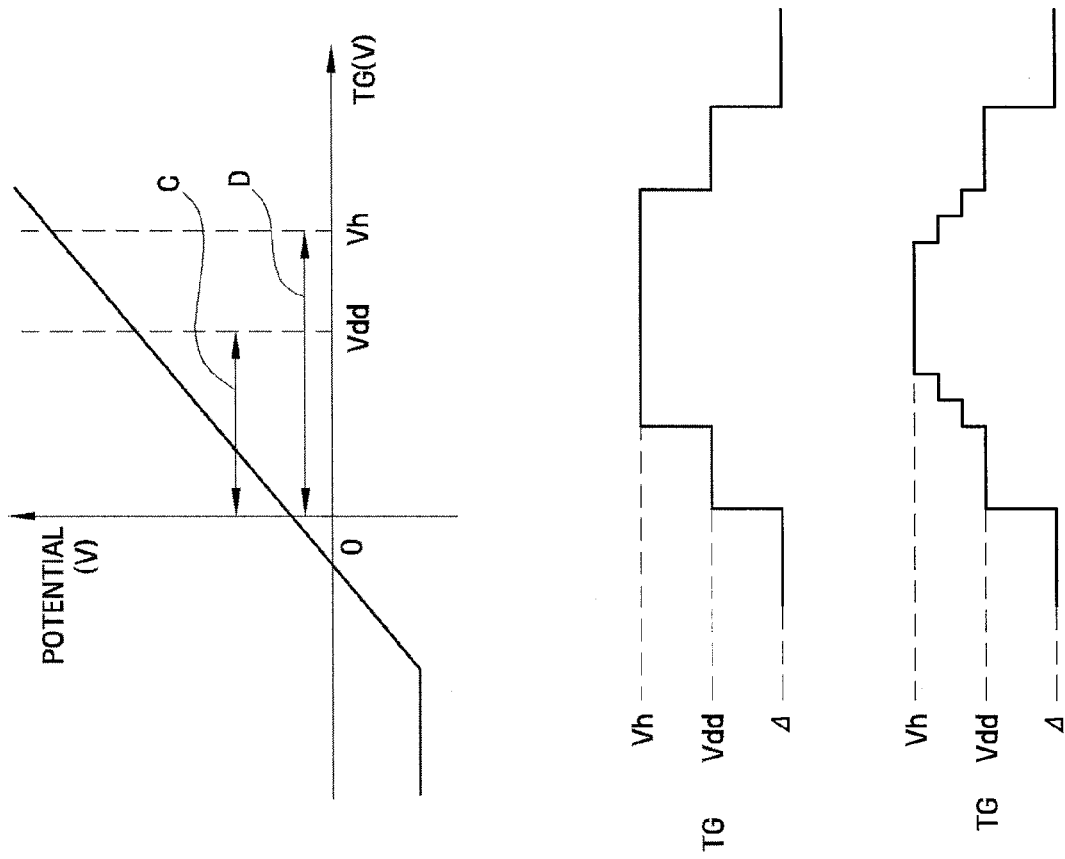

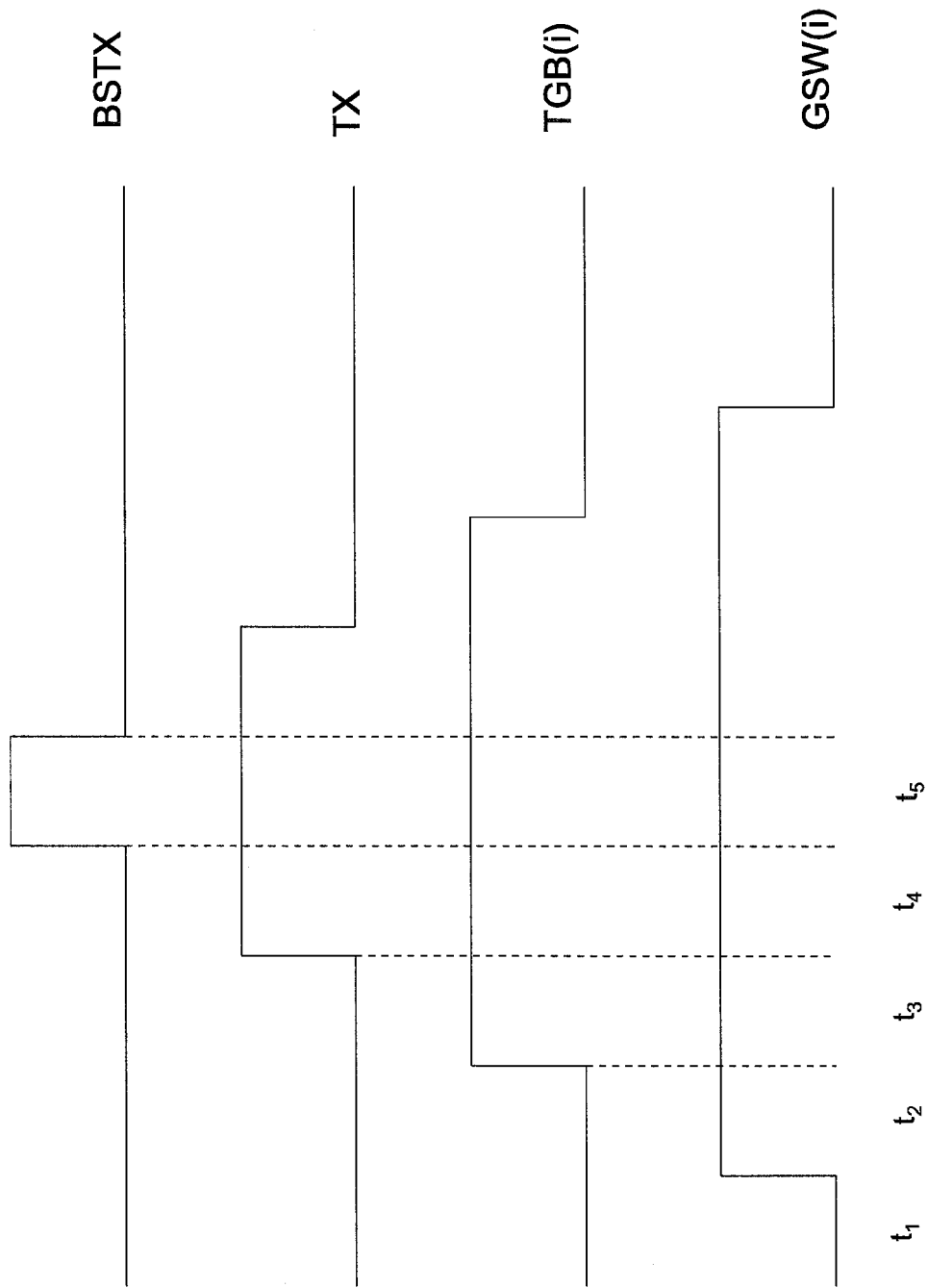

CMOS IMAGE SENSOR AND RELATED METHOD OF OPERATION

CROSS-REFERENCE TO RELATED APPLICATION

This is a divisional of application Ser. No. 11/267,312 filed on Nov. 7, 2005, which is incorporated herein by reference in its entirety.

BACKGROUND OF THE INVENTION

1. Field of the Invention

The present invention relates generally to a Complementary Metal Oxide Semiconductor (CMOS) image sensor and a related method of operation. More particularly, the invention relates to a CMOS image sensor and related method of operation producing reduced afterimage effects.

2. Description of the Related Art

Image sensors find application in a variety of fields, including machine vision, robotics, satellite-based instrumentation, automobiles, navigation and guidance equipment, etc. In general construct, conventional image sensors include a two-dimensional array of pixels formed on a semiconductor substrate. This pixel array defines an image field or image frame.

Each pixel within the plurality of pixels forming the pixel array typically includes a photoelectric conversion element capable of accumulating a quantity of electrical charge in relation to an amount of detected energy (e.g., visible light, etc.). That is, when photons impact the surface of a photoelectric conversion element, free charge carriers are produced. These free charge carriers are subsequently collected by the constituent photoelectric conversion element. Using well understood techniques, the collected free charge carriers are then converted in a read-out operation that allows transfer of a signal (e.g., a voltage or current) corresponding to the quantity of free charge carriers collected. The aggregation of output signals from the plurality of pixels may then be communicated through an output circuit, and subsequently used to generate an image corresponding to the detected energy emanating from the image frame.

Representative conventional image sensors include charge coupled devices (CCDs) and complementary metal oxide semiconductor (CMOS) image sensors. As is generally understood, CCDs have lower noise and produce a better quality image than CMOS image sensors. However, CMOS image sensors are more easily operated and better adapted to a variety of scanning techniques. Furthermore, signal processing circuits can be integrated on a single chip with CMOS image sensors, thus enabling miniaturization of the incorporating product. The compatibility of CMOS image sensors with conventional CMOS fabrication processes also reduces manufacturing costs. CMOS image sensors are also characterized by relatively low power consumption. This characteristic makes CMOS image sensors ideal for products having limited battery capacity. As a result of the foregoing advantages, conventional CMOS image sensors have been widely used in such commercial embodiments as display devices having SVGA (0.5 mega pixel) and MEGA (1 mega pixel) resolutions.

Conventional CMOS image sensors may be fabricated with a variety of specific structures, but are generally formed with a structure comprising four transistors and a photodiode. This structure is commonly referred to as a "4Tr structure." Advantageously, the 4Tr structure may be manufactured using a conventional CMOS fabrication processes.

A conventional CMOS image sensor having a four transistor (4Tr) structure operates in the following manner. The constituent photodiode accumulates electrical charge corresponding to an amount of light energy absorbed. A charge transfer element then transfers the accumulated charge from the photodiode to a charge detection element. An associated amplifier, formed for example by a source follower buffer amplifier and a constant current source, receives an electrical signal from the charge transfer element and outputs a corresponding output signal.

Unfortunately, the transfer of charge from the photodiode in the conventional CMOS image sensor to the charge detection element is often inefficiently or inadequately performed. Residual charge remaining in the photodiode after charge transfer produces so-called "afterimage effects." This phenomenon has the capacity of producing an erroneous image during a subsequent image read operation. The residual charge also tends to reduce the charge integration (i.e., accumulation) capacity of the photodiode. The conversion gain of the photodiode, (i.e., the amount of charge generated per photoelectron) during a subsequent image read operation is also reduced due the erroneous charge distribution between the photodiode and charge detection element.

As a result of the foregoing, multiple conventional attempts have been made to remediate the problem of lingering afterimage effects. Consider, for example, U.S. Pat. No. 6,140,630. In this patent document, one or more specialized charge pump element(s) are provided in relation to the pixel array element of a CMOS imager. The specialized charge pump elements are used to derive an over-voltage signal from Vdd. Each pixel element within a pixel array, and more particularly the charge transfer element of each pixel element, is connected to a charge pump element in order to receive the over-voltage signal. Unfortunately, this conventional approach suffers from several drawbacks. For example, the specialized and specially provided charge pump elements and associated power signal increase the size and complexity of the pixel array element. The over-voltage signal is also constantly ON when applied to the charge transfer and other elements of the individual pixel units forming the pixel array. Accordingly, the constituent elements must be sized appropriately to deal with the over-voltage signal.

A more efficient (e.g., less brute-force) approach is desired to address the ongoing problem of after-image effects in a CMOS imager. That is, an approach is required that does not adversely impact the overall size of the CMOS imager or hazard its constituent elements with a constantly ON over-voltage signal.

SUMMARY OF THE INVENTION

Embodiments of the invention, both apparatus and method related, provide a Complementary Metal Oxide Semiconductor (CMOS) image sensor having a reduced afterimage effect.

In one embodiment, a CMOS image sensor is provided and comprises; a pixel array unit comprising a row of unit pixels, each unit pixel receiving a power voltage and comprising a charge transfer element configured to transfer charge from a photoelectric conversion element to a charge detection element, and a row driving unit configured to provide a charge transfer signal to the charge transfer element, wherein the charge transfer signal is boosted by a boosted voltage signal having a voltage greater than the power voltage only during a charge transfer period.

In another embodiment, a method of operating a CMOS image sensor is provided. The CMOS image sensor includes a row-by-column pixel array of unit pixels receiving an externally provided power voltage, each unit pixel comprising a photoelectric conversion element, a charge detection element and a charge transfer element. The method comprises; collecting charge in the photoelectric conversion element and transferring the collected charge to the charge detection element via the charge transfer element during a charge transfer period, and supplying a boosted voltage signal higher than the power voltage to the charge transfer element only during the charge transfer period.

In yet another embodiment, a CMOS image sensor is provided and comprises; a pixel array unit receiving a power voltage and comprising a plurality of unit pixel rows, each unit pixel comprising a photoelectric conversion element, a charge transfer element and a charge detection element, and each unit pixel row being associated with charge transfer signal line communicating a charge transfer signal to the charge transfer element in each unit pixel, and a switching section associated with a unit pixel row and configured to selectively switch a boosted voltage signal higher than the power voltage onto the charge transfer signal line.

In still another embodiment, a method of operating a CMOS image sensor is provided. The CMOS image sensor comprises a row-by-column pixel array of unit pixels receiving an externally provided power voltage, each unit pixel comprising a photoelectric conversion element, a charge detection element and a charge transfer element. The method comprises; transferring charge from the photoelectric conversion element to the charge detection element via the charge transfer element in accordance with a charge transfer signal applied to the charge transfer element via a charge transfer signal line, and selectively switching a boosted voltage signal higher than the power voltage onto the charge transfer signal line.

In still another embodiment, a CMOS image sensor is provided and comprises; a pixel array receiving a power voltage and comprising a row of pixel units, each pixel unit comprising a charge transfer element controlling charge transfer from a photoelectric conversion element to a charge detection element in response to a boosted voltage signal higher than the power voltage, a boosting capacitor developing a boosting charge, a loading capacitance associated with the row of pixel units, and a switching section configured to divide the boosting charge between the boosting capacitor and the loading capacitance in order to generate, at least in part, the boosted voltage signal.

In still another embodiment, a method of transferring charge developed on a photoelectric conversion element receiving a power voltage to a charge detection element via a charge transfer element in a CMOS image sensor is provided. The method comprises; defining a boosting capacitance, defining a loading capacitance associated with the charge transfer element, dividing charge between the boosting capacitance and the loading capacitance to generate a boosted voltage signal higher than the power voltage, and applying the boosted voltage signal to the charge transfer element.

In still another embodiment, a CMOS image sensor is provided and comprises a pixel array unit comprising a plurality of unit pixel rows, each unit pixel receiving a power voltage and comprising a charge transfer element configured to transfer charge from a photoelectric conversion element to a charge detection element, a driving signal supply section configured to provide a plurality of charge transfer processing signals, each one corresponding to at least one of the plurality of unit pixel rows, at least one boosting section configured to provide a first voltage signal, and at least one switching section configured to receive at least one of the plurality of charge transfer processing signals and further configured to collectively provide the first voltage signal and a second voltage signal to a selected unit pixel row and a non-selected unit pixel row in the pixel array unit, wherein the first voltage signal is higher than the second voltage signal.

BRIEF DESCRIPTION OF THE DRAWINGS

Exemplary embodiments of the invention will be described hereafter with reference to the attached drawings in which like reference numerals refer to like or similar elements. The drawings include:

FIGS. 5A and 5B are graphs illustrating the selected characteristics of a charge transfer element of a CMOS image sensor according to an embodiment of the invention;

FIG. 15B is a timing diagram illustrating the selected inputs to the exemplary CMOS image sensor illustrated in FIG. 15A;

DESCRIPTION OF THE EXEMPLARY EMBODIMENTS

Selected features and advantages associated with several embodiments of the invention are described hereafter with reference to the accompanying drawings. The invention may, however, be implemented in various embodiments, both apparatus and method. The nature and construction of these embodiments may vary widely with specific design and implementation. Yet, the following exemplary embodiments are presented as examples teaching the making and use of the invention. The scope of the invention should not be construed as being limited to only the teaching examples. Rather, the attached claims define the invention.

Throughout this description the terms "low" and "high" refer respectively to logically opposite signal values or levels (e.g., logical values of "0" or "1"). No specific voltage levels or logic standards are mandated by these two terms. Rather, only relative logic states of any particular implementation are implicated.

Figure 1:
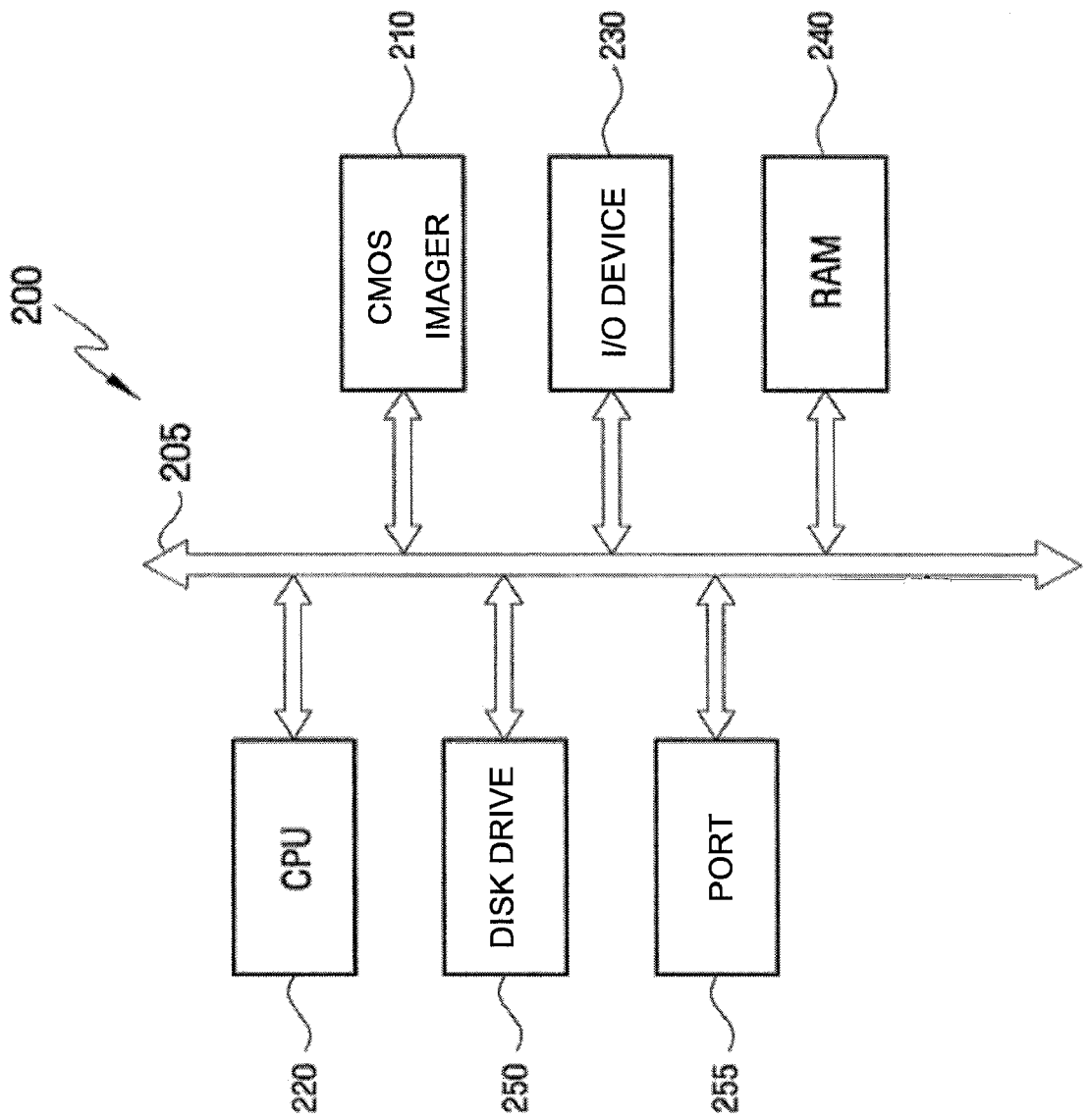
FIG. 1 is a general block diagram of a conventional host system adapted to use a CMOS image sensor.

Before describing selected embodiments of a Complementary Metal Oxide Semiconductor (CMOS) image sensor consistent with the present invention, an exemplary operating context will be discussed. Consider, for example, the general processor-based host system 200 illustrated in FIG. 1. A CMOS image sensor (also referred to in the alternative as "a CMOS imager") 210 generally comprises a pixel array unit. CMOS imager 210 generates an image output by operation of the pixel array unit and communicates an electrical signal corresponding to the image output. This electrical signal may be communicated to Central Processing Unit (CPU) 220 and/or memory (RAM) 240 via a system bus 205. One or more bulk data storage device(s), such as a disk drive 250 or a memory card connected to port 255 (e.g., a memory card slot), and one or more Input/Output (I/O) device(s) 230 may also be connected to system bus 205.

Regardless of specific architectural variations, CMOS imager 210 forms the heart of the host system's imaging capabilities. Thus, the quality of the image data signal produced by the constituent pixel array unit is a critical factor in overall host system performance.

Figure 2:
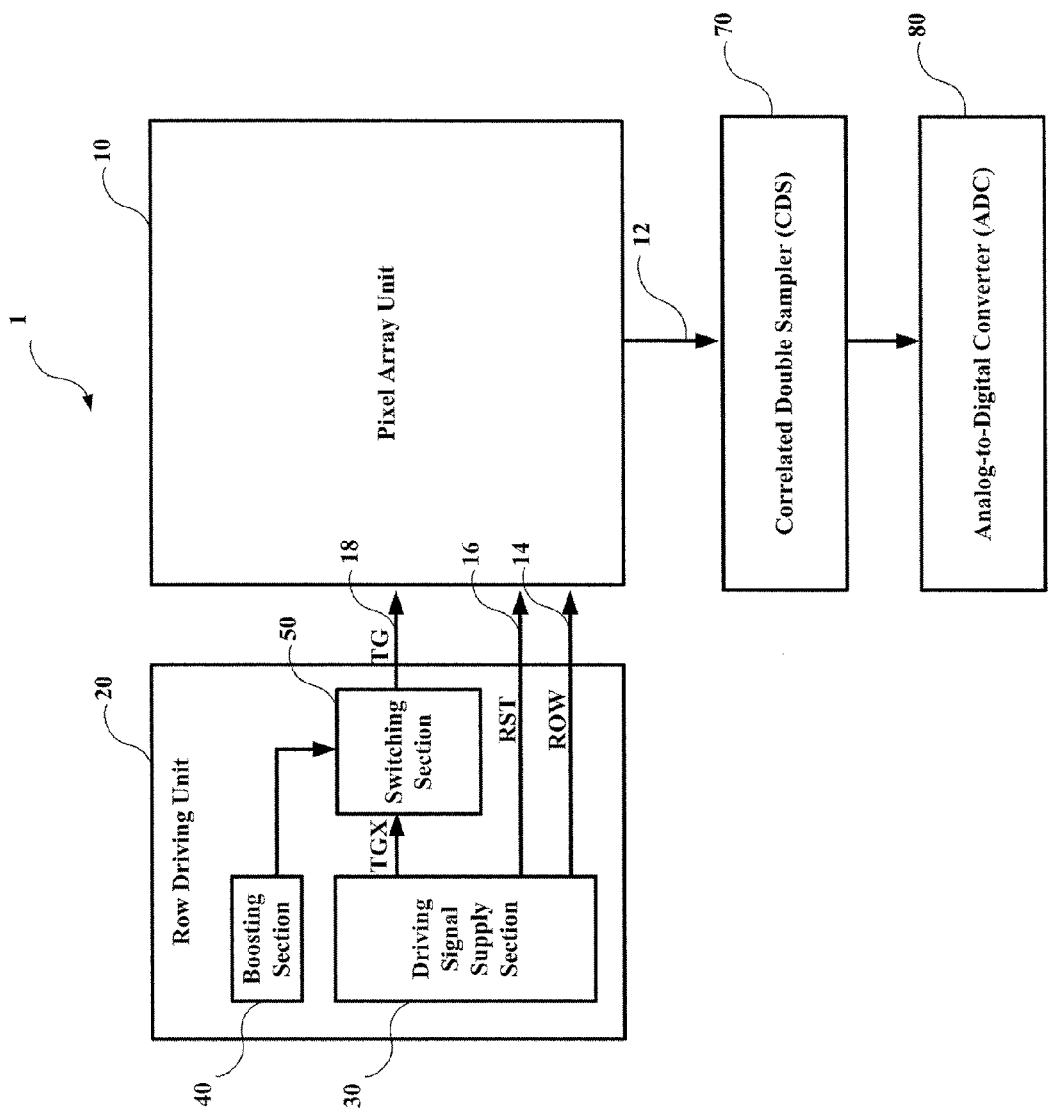
FIG. 2 is an exemplary block diagram illustrating a CMOS image sensor according to one embodiment of the invention.

FIG. 2 is a block diagram illustrating an exemplary CMOS image sensor 1 according to one embodiment of the invention. In FIG. 2, CMOS image sensor 1 generally comprises a pixel array unit 10, a row driving unit 20, a Correlated Double Sampler (CDS) 70, and an analog-to-Digital Converter (ADC) 80.

Pixel array unit 10 comprises a plurality of unit pixels arranged in a row-by-column matrix. Each one of the plurality of the unit pixels absorbs light energy reflected from an object in an image frame, and converts the absorbed light energy into an electrical signal. In the illustrated example, pixel array unit 10 receives a plurality of driving signals, including a pixel selection signal ROW, a reset signal RST, and a charge transfer signal TG from row driving unit 20. The electrical signals produced by pixel array unit 10 are supplied to CDS 70 via a vertical signal line 12.

Row driving unit 20 receives a timing signal and one or more control signal(s) from a controller (not shown) and, as noted above, supplies a plurality of driving signals to pixel array unit 10. The driving signals cooperate to control a read-out operation for the plurality of unit pixels forming pixel array unit 10. In one embodiment, the matrix-type array of unit pixels is conventionally supplied with driving signals in a row-wise manner.

Row driving unit 20 generally comprises a driving signal supply section 30, a boosting section 40, and a switching section 50.

Driving signal supply section 30 supplies the pixel selection signal ROW and reset signal RST to pixel array unit 10. Driving signal supply section 30 also supplies a charge transfer processing signal TGX to switching section 50.

The pixel selection signal ROW controls the selection of unit pixel elements in pixel array unit 10. For example, the pixel selection signal ROW may be applied to select one or more unit pixel element(s) located in the i-th row of pixel array unit 10 via a corresponding i-th pixel selection signal line 14.

The reset signal RST controls a reset operation for unit pixel elements in pixel array unit 10. For example, the reset signal RST may be applied to reset one or more element(s) located in the i-th row of pixel array unit 10 via a corresponding i-th reset signal line 16.

The charge transfer processing signal TGX is supplied to switching section 50 and is used to derive the charge transfer signal TG. The charge transfer signal TG controls one or more charge transfer elements in pixel array unit 10.

Boosting section 40 boosts an externally provided power voltage (e.g., Vdd) to a desired higher voltage. Thus, boosting section 40 comprises in one embodiment a boosting capacitor adapted to receive electrical charge from an externally provided power voltage and then pump additional charge in response to a boosting control signal BSTX to produce a boosted voltage signal. The term "boost" and its derivatives are used throughout this description to indicate the generation or development of a voltage having a potential higher than the externally provided power voltage. Capacitive boosting is used as one example of a boosting process, but embodiments of the invention are limited to only capacitive boosting techniques and related circuits. Indeed, many analogous signal processing techniques, both digital and analog, might just as easily be used to develop the boosted voltage signal applied to the charge transfer element.

Switching section 50 receives the charge transfer processing signal TGX from driving signal supply section 30 and the boosted voltage signal from boosting section 40, and selectively transfers one of these two received signals to one or more charge transfer element(s) in pixel array unit 10.

Unlike conventional boosting circuits, the exemplary CMOS image sensor illustrated in FIG. 2 generates a boosted voltage signal having a voltage higher than the externally provided power voltage, but doesn't constantly hold (e.g., maintain) the boosted voltage at all times. Since the boosted voltage signal is only generated by boosting section 40 on an "as needed" basis, the exemplary CMOS image sensor 1 of FIG. 1 need not be designed to withstand a constantly applied high voltage signal.

CDS 70 generally receives (via e.g., a sample and hold operation) an electrical signal generated by pixel array unit 10 via a vertical signal line 12. In the illustrated example, CDS 70 is assumed to perform a conventional double sampling operation—comprising one sample at a predetermined reference voltage level (hereinafter, referred to as the "noise level") and another sample at a voltage level defined by a target electrical signal (hereinafter, referred to as "signal level")—and thereafter outputs a "difference level signal" indicating a level difference between the noise level and the signal level. Other types of sampling operations might be alternatively used, but CDS 70 is generally responsible for suppressing a fixed noise level resulting from feature distribution of the unit pixels in pixel array unit 10 and vertical signal line 12. A programmable amplifier (not shown in FIG. 2) may be optionally used to receive the difference level signal from CDS 70 and output a corresponding analog signal with appropriate gain.

ADC 80 receives the analog signal from CDS 70 (or optionally through the amplifier) and outputs a digital signal adapted to provide offset correction. As is conventionally understood, the output digital signal may be latched in a latch element (not shown) and further processed by a data selection element (not shown). The conventional latched signal may then be supplied to a multiplexing element (not shown). The multiplexing element serially arranges the received signals and supplies the serially arranged signals to an image signal processing element (not shown).

Figure 3:
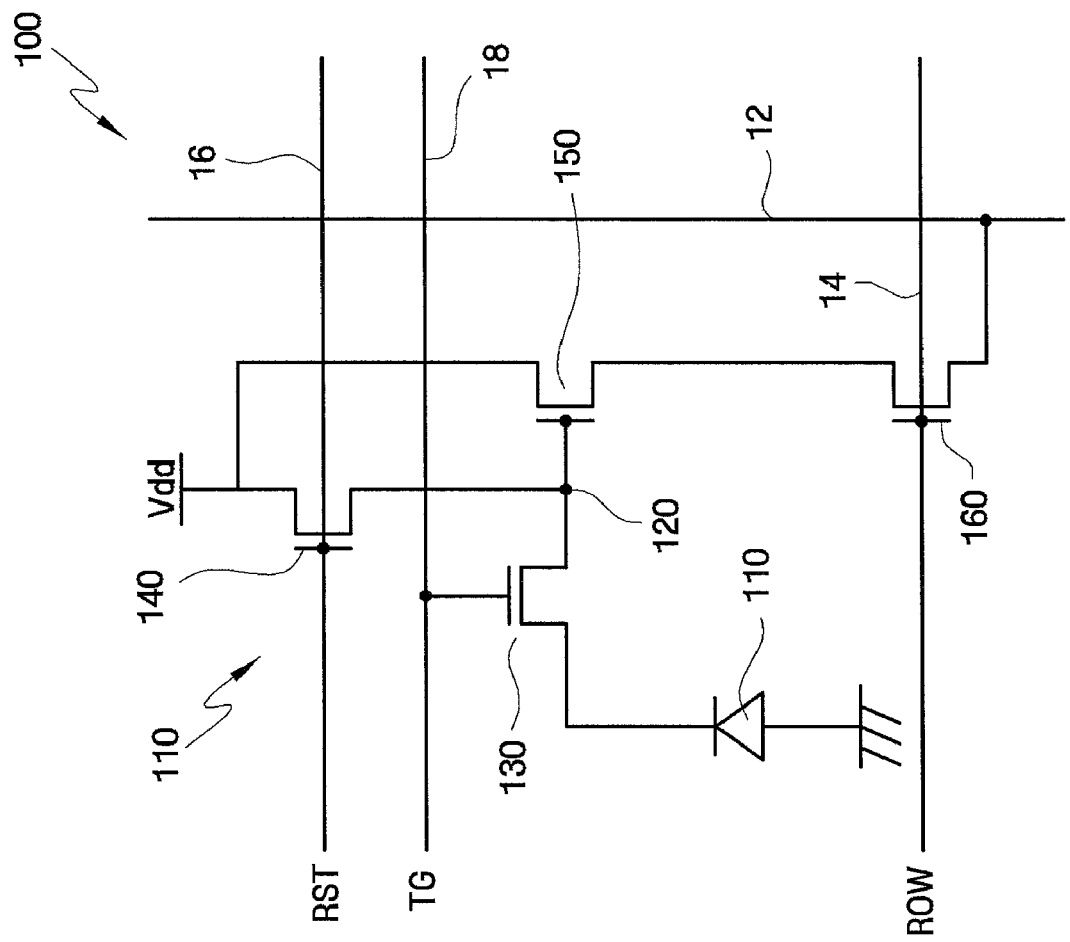
FIG. 3 is an exemplary circuit diagram of a unit pixel of a CMOS image sensor adapted for use within one embodiment of the invention.
Figure 4:
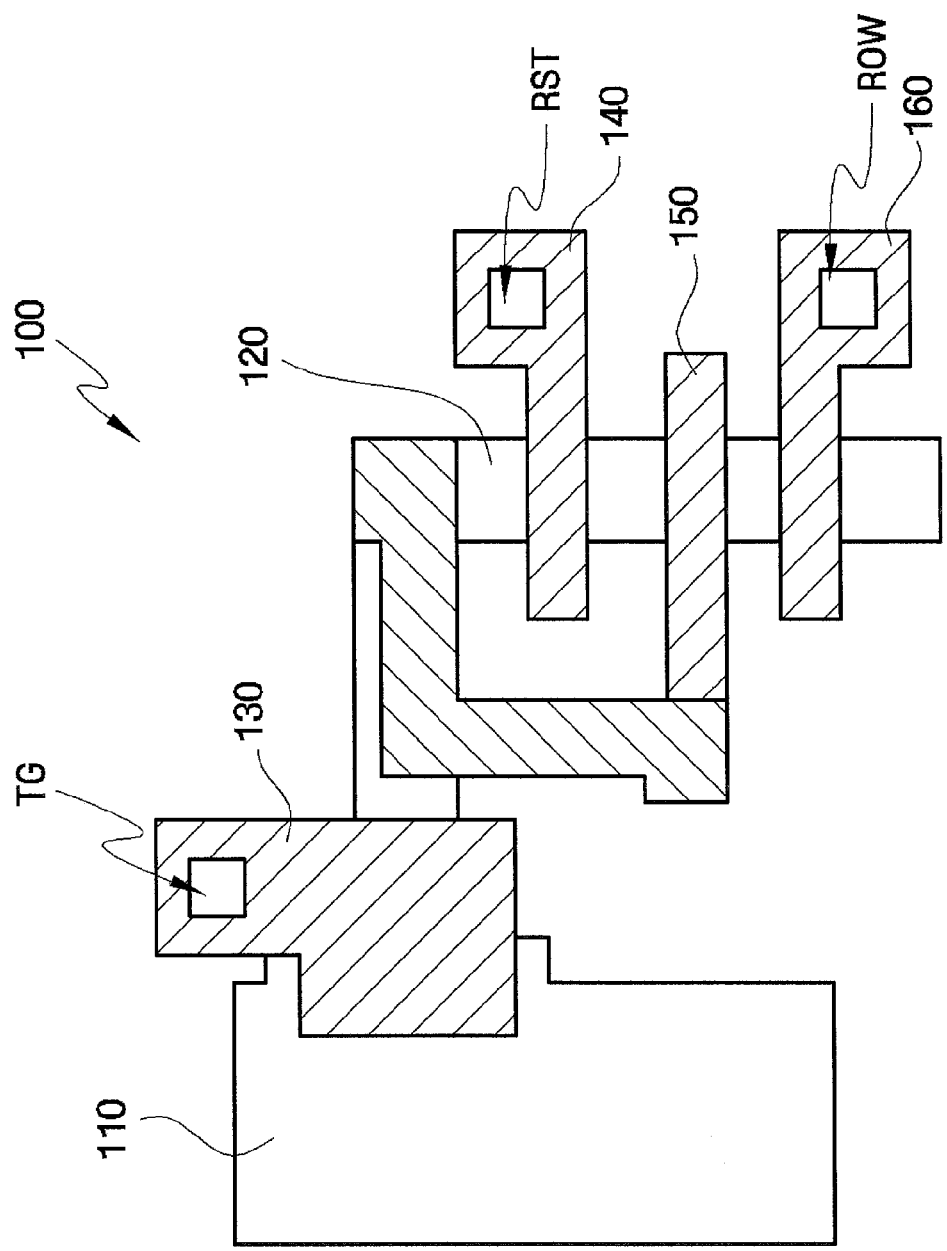
FIG. 4 is an exemplary schematic plan view of a unit pixel of a CMOS image sensor according to an embodiment of the invention.

FIG. 3 is a circuit diagram of an exemplary unit pixel adapted for use within one embodiment of a CMOS image sensor according to the invention. FIG. 4 is a schematic plan view related to the exemplary unit pixel of FIG. 3.

Referring collectively to FIGS. 3 and 4, an exemplary unit pixel 100 of a CMOS image sensor comprises a photoelectric conversion element 110, a charge detection element 120, a charge transfer element 130, a reset element 140, an amplification element 150, and a selection element 160. The term "element" is used here to broadly indicate individual (or combinations of) electrical components, impurity diffusion regions, voltage nodes, and/or related signals lines. Those of ordinary skill in the art will recognize that many specific implementations of the recited "elements" are possible.

Photoelectric conversion element 110 collects charge generated from the absorption of light energy. Photoelectric conversion element 110 may be formed, for example, from a photodiode, a phototransistor, a photogate, and/or a pinned photo diode (PPD).

In one embodiment, a floating diffusion region may be used to form charge detection element 120, but other structures might serve equally well. Using an inherent parasitic capacitance, charge detection element 120 receives and accumulates charge collected in photoelectric conversion element 110. In the illustrated example, charge detection element 120 is electrically connected to the gate of amplification element 150 to thereby control amplification element 150.

Charge transfer element 130 controls the transfers of charge from photoelectric conversion element 110 to charge detection element 120. Charge transfer element 130 may be formed from one or more transistors. In the illustrated example charge transfer element 130 is controlled by charge transfer signal TG.

Reset element 140 periodically resets charge detection element 120. In the illustrated example, the source of the transistor forming reset element 140 is connected to charge detection element 120 and the drain of the reset element 140 is connected to an external power voltage (Vdd). Reset element 140 is driven in the example using reset signal RST.

In the illustrated example, amplification element 150 takes the form of a source follower buffer amplifier in combination with an external constant current generator (not shown). However specifically implemented, amplification element 150 outputs a variable voltage to vertical signal line 12 in response to the voltage received by charge detection element 120. In the example, the source of amplification element 150 is connected to the drain of selection element 160 and the drain of amplification element 150 is connected to an external power voltage (Vdd).

Selection element 160 serves to select the unit pixel to be read out in a row-wise manner and is driven by the pixel selection signal ROW. The source of the transistor forming selection element 160 in the illustrated example is connected to vertical signal line 12.

Of note, the respective driving signal lines (14, 16, and 18) associated with charge transfer element 130, reset element 140, and selection element 160 are assumed in the illustrated example to extend in a row-wise direction to additional unit pixels belonging to the same row in unit pixel 100.

The boosted voltage signal supplied by boosting section 40 will now be described in some additional detail with reference to FIGS. 5A and 5B and with further contextual reference to FIGS. 3 and 4. In one related embodiment, charge transfer element 130 may be formed from an enhancement type transistor having a low threshold voltage or a depletion type transistor in order to prevent overflow or the so-called blooming phenomenon associated with photoelectric conversion element 110 when an excessive amount of light energy is received. That is, one embodiment of the CMOS image sensor according to the invention may include a separate overflow path formed by use of a common enhancement type transistor.

FIG. 5A illustrates a voltage relationship between the charge transfer signal TG, as applied to the gate of charge transfer element 130 in the illustrated example, and a corresponding stepped voltage potential developed at charge transfer element 130—assuming for the sake of the current illustration that an enhancement type transistor having a low threshold voltage is used to form charge transfer element 130.

With this assumption in place, even when a "low" signal is applied to the gate of charge transfer element 130, a channel can be formed by a predetermined voltage higher than the threshold voltage of charge transfer element 130. This channel allows charge generated by photoelectric conversion element 110 in an amount greater than a predetermined amount to be partially mobilized into charge detection element 120. In one related embodiment, a $P^+$ type dopant is ion-implanted into a selected portion of the surface of the semiconductor substrate corresponding to charge transfer element 130 in order to form a channel region.

With reference to FIG. 5A, operation of a conventional CMOS image sensor results in a nominal voltage potential (V) being developed in relation to an externally provided power voltage (Vdd) through a range (A) when the charge transfer signal TG is "high". In contrast, operation of a CMOS image sensor according to one embodiment of the invention results in a greater voltage potential (V) being developed in relation to the boosted voltage signal (Vh) supplied during at least part of a defined charge transfer period. Of course, the supply period for the boosted voltage signal (Vh) may vary according to design of the CMOS image sensor. Here, the phrase "during at least part of a defined charge transfer period" subsumes at least a time period during which the boosted voltage signal (Vh) is supplied by boosting section 40 to one or more rows of pixel array unit 10, and/or a time period sufficient to transfer charge to charge detection element 120 via charge transfer element 130. For example, the boosted voltage signal (Vh) may be supplied for a period of time ranging from between about 0.1 to 10 μs.

In one related embodiment, boosted voltage signal (Vh) may be variably boosted in several discrete levels above the externally supplied voltage (Vdd). (Compare the respective TG waveforms shown in FIG. 5A). By so doing, any stress that might be caused by an abrupt application of the boosted voltage signal (Vh) may be reduced or avoided.

Of further note, use of the boosted voltage signal (Vh) allows the potential of charge transfer element 130 to be higher than that of photoelectric conversion element 110, which further facilitates charge transfer. In one specific embodiment, a boosted voltage signal of 4 to 5V was successfully used.

FIG. 5B further illustrates an exemplary relationship between a charge transfer signal TG applied to the gate of charge transfer element 130 and the development of a voltage potential when a depletion type transistor is used as the charge transfer element 130.

Again, with the illustrative assumptions in place, by use of a depletion type transistor, even when charge transfer element 130 is in an inactivated state, a channel is present. Therefore, charge generated in excess of a predetermined amount by photoelectric conversion element 110 can partially be mobilized into charge detection element 120 via charge transfer element 130, as previously described. Here, however, the channel region may be formed by selective ion implantation of an $N^-$ dopant into a selected surface portion of the semiconductor substrate corresponding to charge transfer element 130.

With reference to FIG. 5B, operation of a conventional CMOS image sensor results in development of a voltage potential (C) in relation to the application of externally provided power voltage (Vdd) when the charge transfer signal TG is "high". In contrast, operation of a CMOS image sensor according to one embodiment of the invention results in development of a voltage potential (D) in relation to the application of the boosted voltage signal (Vh) supplied during at least part of a defined charge transfer period.

As illustrated in relation to FIG. 5A, the boosted voltage signal (Vh) may be boosted in several discrete levels above the externally supplied voltage (Vdd). (Compare the respective TG waveforms shown in FIG. 5B). Use of the boosted voltage signal (Vh) allows the voltage potential at charge transfer element 130 to be higher than that of photoelectric conversion element 110.

Figure 6:
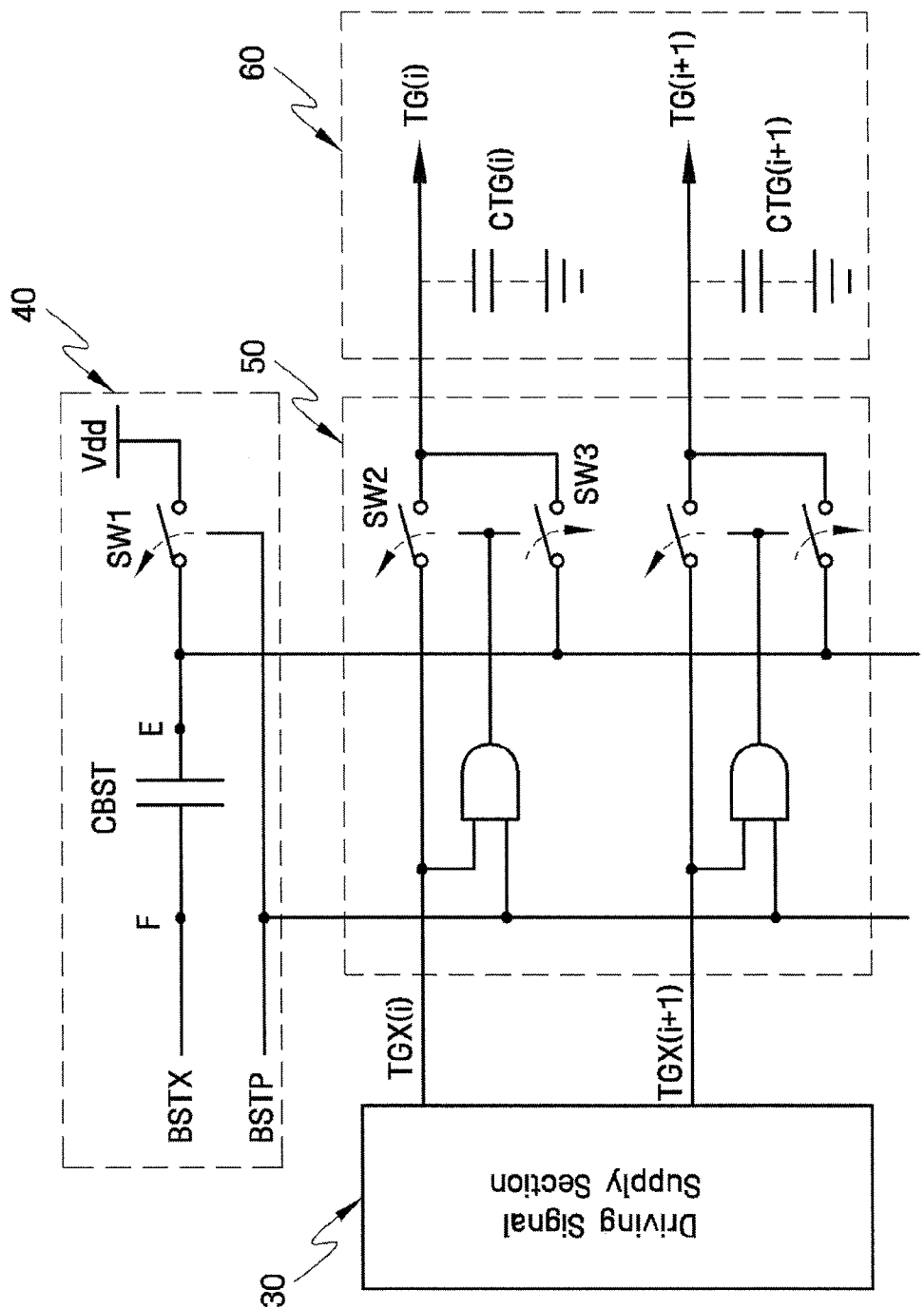
FIG. 6 is an exemplary logic diagram illustrating a boosting section and a switching section of the CMOS image sensor according to an embodiment of the invention.
Figure 7:
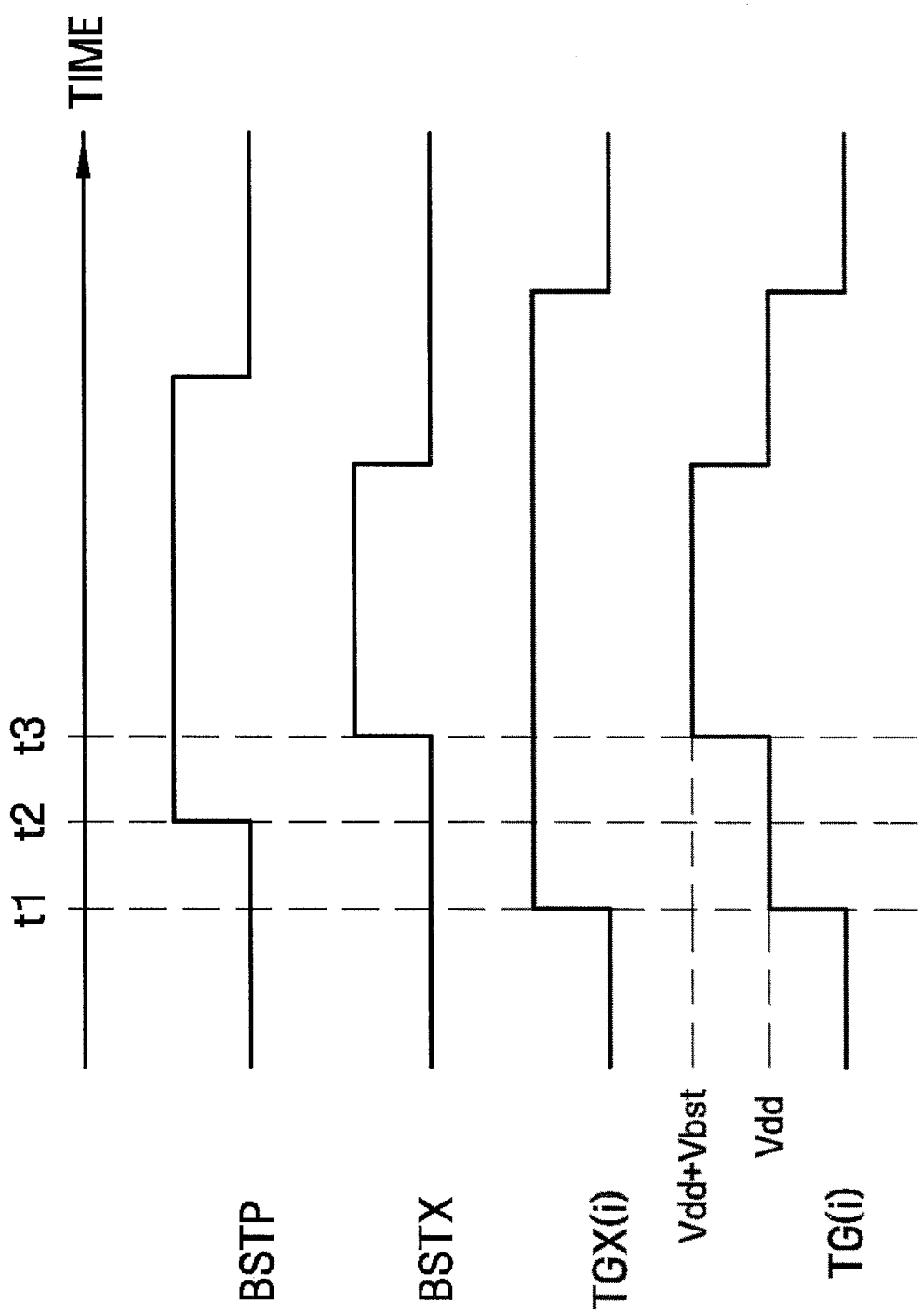
FIG. 7 is a timing diagram further illustrating operation of the boosting section and the switching section of the exemplary CMOS image sensor of FIG. 6.

FIG. 6 conceptually illustrates an exemplary boosting section 40 and an exemplary switching section 50 for a CMOS image sensor according to one embodiment of the invention. FIG. 7 is a related timing diagram for boosting section 40 and switching section 50 shown in FIG. 6. The term "section" is used here to broadly indicate one or more circuits, components, component combinations, elements, and element combinations. These sections may be variously implemented.

Referring collectively to FIGS. 6 and 7, a charge transfer signal TG is presumed to be commonly applied to unit pixels belonging to a corresponding row of pixel array unit 10. In the illustrated example, pixel array unit 10 is assumed to comprise N rows. For convenience of illustration, only a single charge transfer processing signal TGX(i) and a corresponding charge transfer signal TG(i) associated with an i-th row selected from the N rows of pixel array unit 10 are illustrated and described hereinafter.

Referring to FIG. 6, driving signal supply section 30 is controlled by a controller (not shown) and supplies the charge transfer processing signal TGX(i) to switching section 50. Boosting section 40 boosts the externally provided power voltage (Vdd) and supplies the boosted voltage signal to switching section 50. In the illustrated example, boosting section 40 commonly supplies the boosted voltage signal to all rows of pixel array unit 10.

In the illustrated example, a boosting capacitor CBST is charged by the externally provided power voltage (Vdd), and is additionally pumped to develop a desired amount of charge in response to boosting control signal BSTX. Other charge pumping arrangements might of course be used. However, continuing with the illustrated example, a first switch SW1 is controlled by a pre-boosting signal BSTP. When the pre-boosting signal BSTP is "low", the first switch SW1 is turned ON and boosting capacitor CBST is charged. At the same time, node E is charged by the externally provided power voltage (Vdd) and node F is charged to 0V. When the pre-boosting signal BSTP transitions to "high", the first switch SW1 is turned OFF. At this time, the boosting control signal BSTX transitions to "high", the voltage apparent at node F moves to the voltage of the externally provided power voltage, and the boosting capacitor CBST begins pumping charge. In this manner, the boosted voltage signal is provided.

As viewed externally and upon receiving the charge transfer signal TG(i), charge transfer element 130 looks like a loading capacitor CTG(i) of several pF of capacitance. Thus, the boosting capacitor CBST and the loading capacitor CTG(i) are effectively coupled to perform charge sharing. The combination of one or more output signal lines and loading capacitor(s) CTG(i) may be viewed as row driving unit output section 60.

With the foregoing assumptions drawn from the illustrated example, a boosting voltage (Vbst) may be calculated according to Equation 1 below:

$$Vbst = Vdd * \left\{ \frac{CBST}{CBST + CTG(i)} \right\}, \quad (1)$$

In this equation the loading capacitor CTG(i) may be formed from a number of capacitive sources, including for example, parasitic capacitances associated with output of the charge transfer signal line, a designed boot strap capacitor, or some additionally provided discrete capacitance provided to define the desired boosting voltage. Therefore, given a prescribed value for Vdd, the process of defining a desired boosting voltage Vbst may understood in one aspect as a process of selecting appropriate values for the boosting capacitor CBST and the loading capacitor CTG. In a related aspect, this process may be further understood as a process in which control signals inherent in the operation of the CMOS image sensor are used in conjunction with these two defined capacitive values to develop and divide charge between the boosting capacitor and the loading capacitor only during a defined window of time in which charge is normally transferred from photoelectric conversion element 110 to charge detection element 120 via charge transfer element 130.

For example, when the capacitance of the boosting capacitor CBST is nine times higher than that of a loading capacitor CTG(i), 90% of the externally provided power voltage (Vdd) is subjected to boosting. When the capacitance of the boosting capacitor CBST is sufficiently higher than that of the loading capacitor CTG(i), the boosting voltage (Vbst) becomes that of externally provided power voltage (Vdd). Thus, it is preferable that the capacitance of the boosting capacitor CBST be 2 to 10 times higher than that of loading capacitor CTG(i). In several representative embodiments, a boosting capacitor CBST having a capacitance of 10 to 20 pF was used, but the invention is not limited only to capacitances in this range.

Switching section 50 receives the charge transfer processing signal TGX(i) from driving signal supply section 30 and the boosted voltage signal from boosting section 40, and then selectively transfers one of these two signals to the charge transfer element. In the embodiment shown in FIG. 6, the charge transfer processing signal TGX(i) is transferred to the charge transfer element via a second switch SW2(i) and the boosted voltage signal is transferred to the charge transfer element via a third higher switch SW3(i).

The second switch SW2(i) and third switch SW3(i) are alternately turned ON. The second switch SW2(i) and third switch SW3(i) are controlled by the logically "ANDed" combination of the pre-boosting signal BSTP and the charge transfer processing signal TGX(i). The second switch SW2(i) is turned ON when the "ANDed" signal is "low," whereas third the switch SW3(i) is turned ON when the "ANDed" signal is "high." In the illustrated embodiment, the charge transfer processing signal TGX(i) transitions to "high" and then the pre-boosting signal BSTP transitions to "high". Thus, when pre-boosting signal BSTP transitions to "high", the third switch SW3(i) is turned ON.

Referring now to the timing diagram of FIG. 7, the operation of boosting section 40 and switching section 50 in the exemplary embodiment illustrated in FIG. 6 will be further described. At time (t1), the pre-boosting signal BSTP and boosting control signal BSTX are "low", and the charge transfer processing signal TGX(i) transitions to "high". Thus, the first switch SW1 is turned ON, thereby charging the boosting capacitor CBST. Also at time (t1), since the "ANDed" signal of the pre-boosting signal BSTP and charge transfer processing signal TGX(i) is "low", the second switch SW2(i) is also turned ON. Therefore, the charge transfer processing signal TGX(i) is transferred to charge transfer element 130 via the second switch SW2(i).

At time (t2), the pre-boosting signal BSTP transitions to "high". Therefore, the first switch SW1 is turned off, and the boosting capacitor CBST is allowed to float. Since the "ANDed" combination of the pre-boosting signal BSTP and the charge transfer processing signal TGX(i) transitions to "high", the second switch SW2(i) is also turned OFF, but the third switch SW3(i) is turned ON.

At time (t3), the boosting control signal BSTX transitions to "high". Therefore, the boosting capacitor CBST begins to pump charge. The boosting voltage (Vbst) rises according to Equation 1 above, and the charge transfer signal TG(i) accordingly rises to (Vdd+Vbst).

Figure 8:
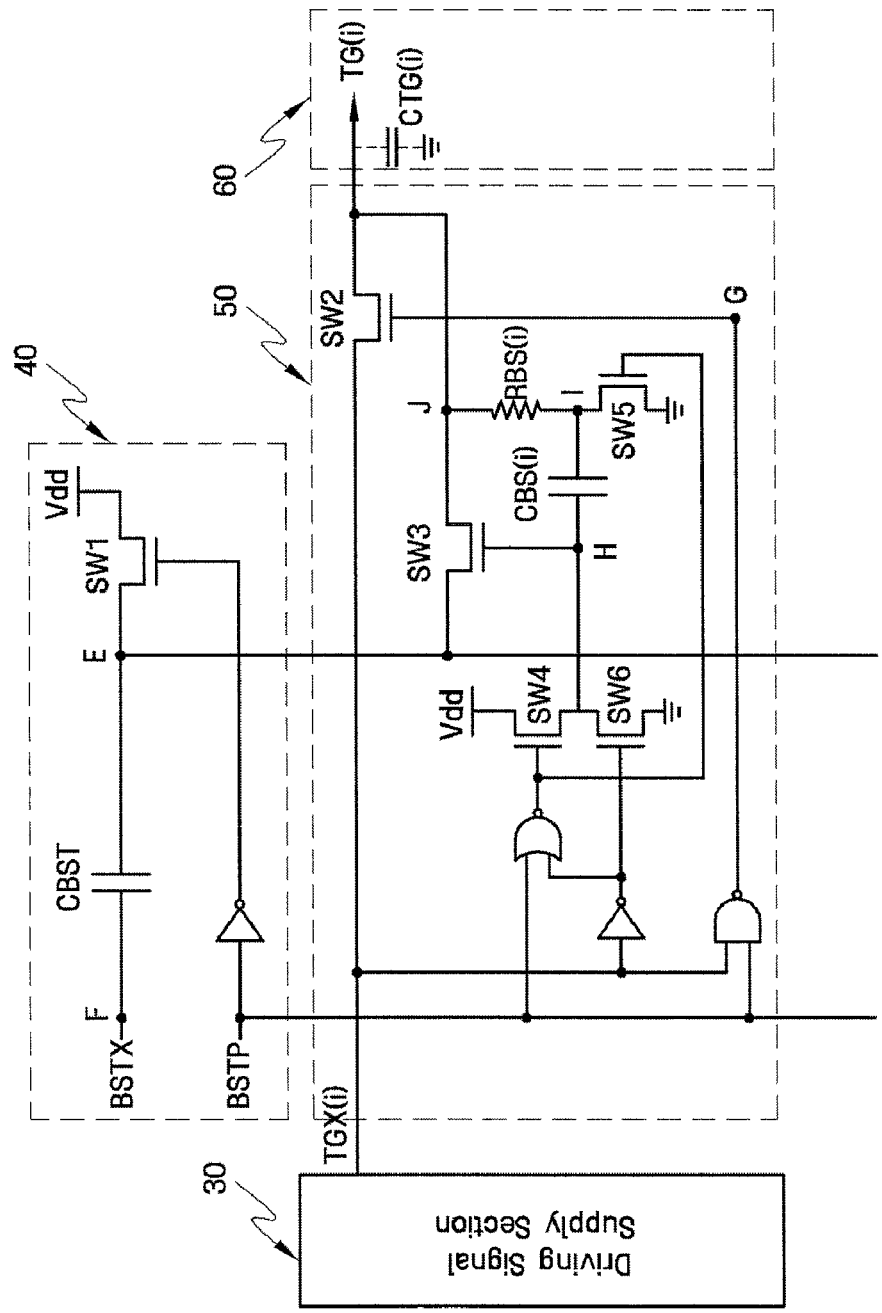
FIG. 8 is an exemplary circuit diagram illustrating a boosting section and a switching section of a CMOS image sensor according to an embodiment of the invention.
Figure 9:
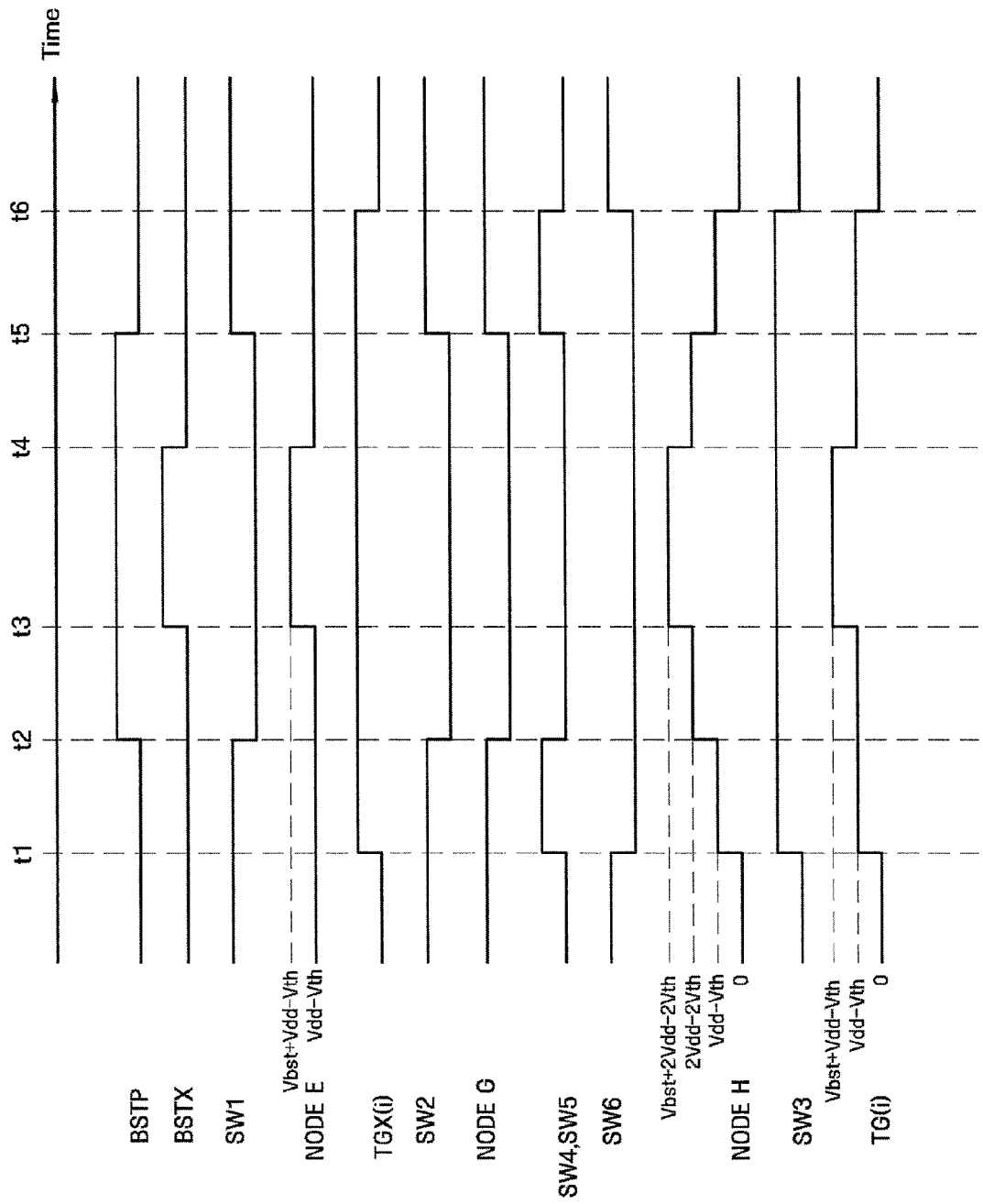
FIG. 9 is a timing diagram further illustrating the boosting section and the switching section of the CMOS image sensor of FIG. 8.

FIG. 8 is a circuit diagram illustrating a boosting section and a switching section of a CMOS image sensor according to another embodiment of the invention, and FIG. 9 is a related timing diagram. Constituent elements analogous to those described in relation to FIG. 6 are represented in FIG. 8 with similar reference numerals and/or abbreviations. A more detailed description of these common elements is omitted.

Referring to FIG. 8, boosting section 40 again boosts an externally provided power voltage (Vdd) and supplies the boosted voltage signal to switching section 50.

Here again, boosting capacitor CBST is charged with the externally provided power voltage (Vdd). When the boosting control signal BSTX transitions to "high", the boosting capacitor CBST pumps charge and supplies the boosted voltage signal to switching section 50. A first switch SW1 located between the externally provided power voltage (Vdd) and the boosting capacitor CBST is controlled by an inverted version of the pre-boosting signal BSTP.

Switching section 50 receives the charge transfer processing signal TGX(i) from driving signal supply section 30 and the boosted voltage signal from boosting section 40, and then selectively transfers one of these two signals to a corresponding charge transfer element. That is, the charge transfer processing signal TGX(i) is transferred to the charge transfer element via a second switch SW2(i) or the boosted voltage signal is transferred to the charge transfer element via a third switch SW3(i).

A boot strap capacitor CBS(i) electrically connects the gate and source of the third switch SW3(i) thereby allowing a potential difference between the gate and source to be held at a predetermined level. In a related aspect, the boot strap capacitor CBS(i) has a capacitance sufficient to compensate for the parasitic capacitance and junction leakage of related element(s). For example, the capacitance of the boot strap capacitor CBS(i) may be in the range of from 0.001 to 0.1 pF.

The boot strap capacitor CBS(i) is charged with the externally provided power voltage (Vdd) when a fourth switch SW4(i) and a fifth switch SW5(i) are turned ON. The fourth switch SW4(i) and the fifth switch SW5(i) are controlled by the logically "NORed" combination of inverted charge transfer processing signal TGX(i) and the pre-boosting signal BSTP.

Prior to being charged with the externally provided power voltage (Vdd), the boot strap capacitor CBS(i) is discharged to 0V when a sixth switch SW6(i) is turned ON to form a discharged path to ground. The sixth switch SW6(i) is controlled by inverted charge transfer processing signal TGX(i).

A boot strap resistance RBS(i) maintains a potential difference between a node I and a node J when the fifth switch SW5(i) is turned ON. When the fifth switch SW5(i) is turned OFF, node I and node J will have the same voltage potential.

In the foregoing example, the circuit(s) driving boosting section 40 and switching section 50 may be formed from conventional NMOS transistor circuitry in view of driving characteristics and manufacturing process considerations implicated in specific implementations of the various circuitry generally described above.

Operation of boosting section 40 and switching section 50 illustrated in the CMOS image sensor of FIG. 8 will now be described in some additional detail with reference to the related timing diagram of FIG. 9.

At presumed time before (t1), the pre-boosting signal BSTP is "low" and therefore the first switch SW1 is turned ON. Also, the charge transfer processing signal TGX(i) is "low" and thus the sixth switch SW6(i) is turned ON.

In the illustrated example, since the first switch SW1 is an NMOS transistor, a node E is charged with a voltage (Vdd−Vth). Thus, the voltage of the boosting capacitor CBST is converted to (Vdd−Vth). Since the sixth switch SW6(i) is turned ON, a node H is maintained at a level of 0V. Thus, the third switch SW3(i) is turned OFF.

Since the charge transfer processing signal TGX(i) and the pre-boosting signal BSTP are "low", a node G is "high". Therefore, the second switch SW2(i) is turned ON and the charge transfer signal TG(i) is "low".

At time (t1), the charge transfer processing signal TGX(i) transitions to "high" and the second switch SW2(i) is turned ON. Thus, the charge transfer signal TG(i) is converted to (Vdd−Vth).

Here, the fourth switch SW4(i) and the fifth switch SW5(i) are turned ON and the sixth switch SW6(i) is turned OFF. Thus, the boot strap capacitor CBS(i) is charged with a voltage (Vdd−Vth), and the voltage at node H is converted to (Vdd−Vth). As a result, the third switch SW3(i) is turned ON. When the third switch SW3(i) is turned ON, the voltage (Vdd−Vth) at node E is transferred to node J. The boot strap resistance RBS(i) induces a voltage drop between node J and node I. Therefore, the voltage at node J is converted to (Vdd−Vth) and the voltage at node I is converted to 0V.

At time (t2), the pre-boosting signal BSTP transitions to "high". Therefore, the first switch SW1 and second switch SW2(i) are turned OFF. However, since the voltage at node E is transferred to node J via third switch SW3(i), the charge transfer signal TG(i) can be maintained at (Vdd−Vth).

Also at time (t2), the fourth switch SW4(*i*) and the fifth switch SW5(*i*) are turned OFF. Therefore, node I and node J have the same voltage, (Vdd−Vth). When node I is converted from 0V to (Vdd−Vth), node H is converted to (2Vdd−2Vth) by the boosting operation of the boot strap capacitor CBS(i).

At time (t3), the boosting control signal BSTX transitions to "high". Therefore, the boosting capacitor CBST pumps charge. However, upon receiving the charge transfer signal TG(i), as view externally, the charge transfer element looks like a loading capacitor CTG(i) having a capacitance of several pF. Thus, the boosting capacitor CBST and loading capacitor CTG(i) charge share in a coupled arrangement described in Equation 1 above. In this regard, when the boosting capacitor CBST pumps charge, the voltage at node E can be converted to (Vbst+Vdd−Vth).

If the capacitance of the boosting capacitor CBST is sufficiently higher than that of the loading capacitor CTG(i), the boosting voltage Vbst can be considered to be the externally provided power voltage (Vdd). Thus, to sufficiently increase the boosting voltage Vbst, it is advisable in selected embodiments to increase the capacitance of the boosting capacitor CBST. In relation to these embodiments, the capacitance of the boosting capacitor CBST may be 2 to 10 times higher than that of the loading capacitor CTG(i).

Since the third switch SW3(*i*) is still ON, the voltage at node E is transferred to node J and the charge transfer signal TG(i) is converted to (Vbst+Vdd−Vth). However, since the voltage at node I and the voltage at node J rise together, the voltage at node H is converted to (Vbst+2Vdd−2Vth) by the boosting operation of the boot strap capacitor CBS(i).

At time (t4), the boosting control signal BSTX transitions to "low". Therefore, the voltage VCBST of the boosting capacitor CBST is again converted to (Vdd−Vth) and the voltage at node E is converted to (Vdd−Vth).

At this time, the third switch SW3(*i*) is still ON. Therefore, the voltage at node E is transferred to node J and thus the charge transfer signal TG(i) is converted to (Vdd−Vth). Since the voltage at node I and the voltage at node J fall together, the voltage at node H is converted to (2Vdd−2Vth).

At time (t5), the pre-boosting signal BSTP transitions to "low". Therefore, the first switch SW1 and the second switch SW2(*i*) are turned ON. At this time, since the fourth switch SW4(*i*) and the fifth switch SW5(*i*) are turned ON, the voltage at node H is converted to (Vdd−Vth) and the voltage at node I is converted to 0V.

At time (t6), the charge transfer processing signal TGX(i) transitions to "low". Therefore, the fourth switch SW4(*i*) and fifth switch SW5(*i*) are turned OFF and the sixth switch SW6(*i*) is turned ON. As a result, the boot strap capacitor CBS(i) is discharged to 0V. Also at this time, since the voltage at node H is maintained at 0V, the third switch SW3(*i*) is turned OFF.

Also, since a "low" charge transfer processing signal TGX(i) is transferred to the charge transfer element via the second switch SW2(*i*), the charge transfer signal TG(i) transitions to "low".

Figure 10:
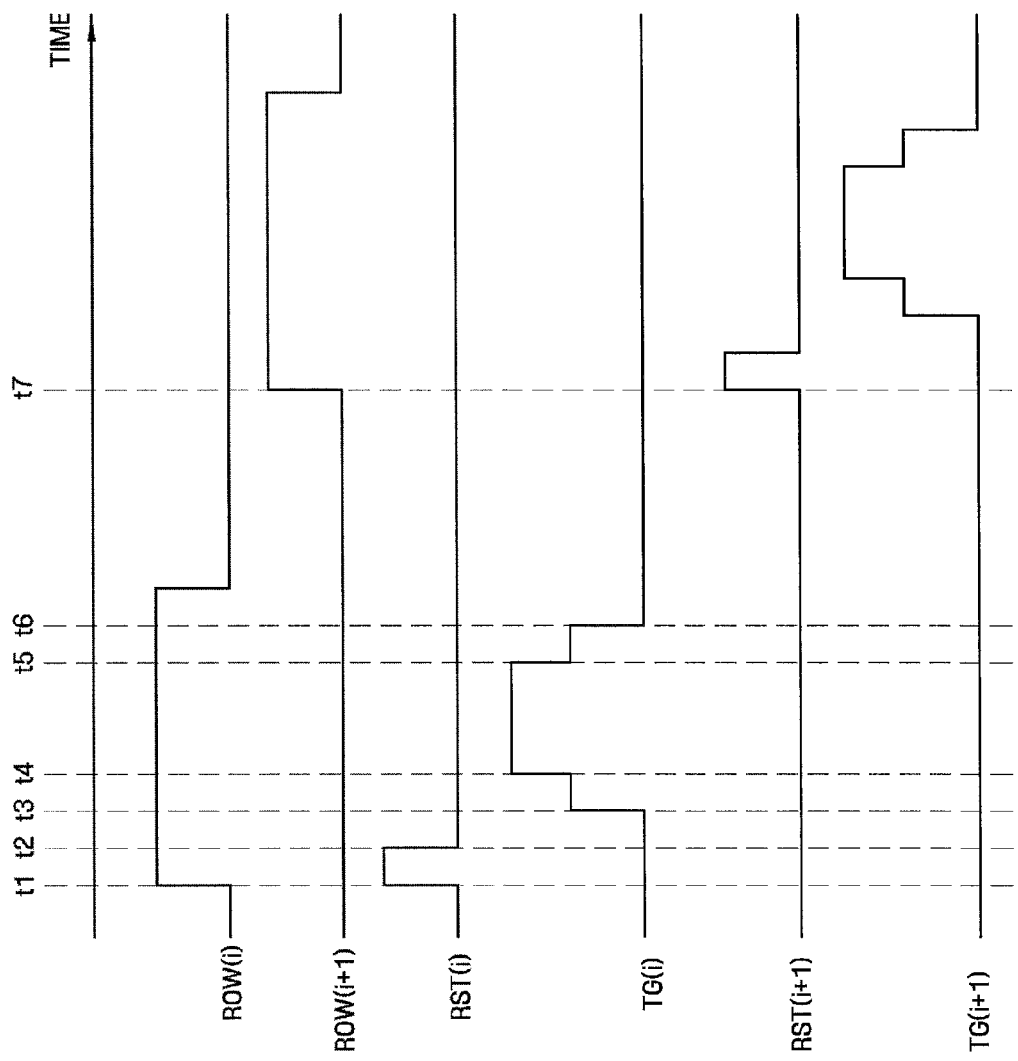
FIG. 10 is a timing diagram illustrating the operation of the CMOS image sensor according to an embodiment of the invention.
Figure 11:
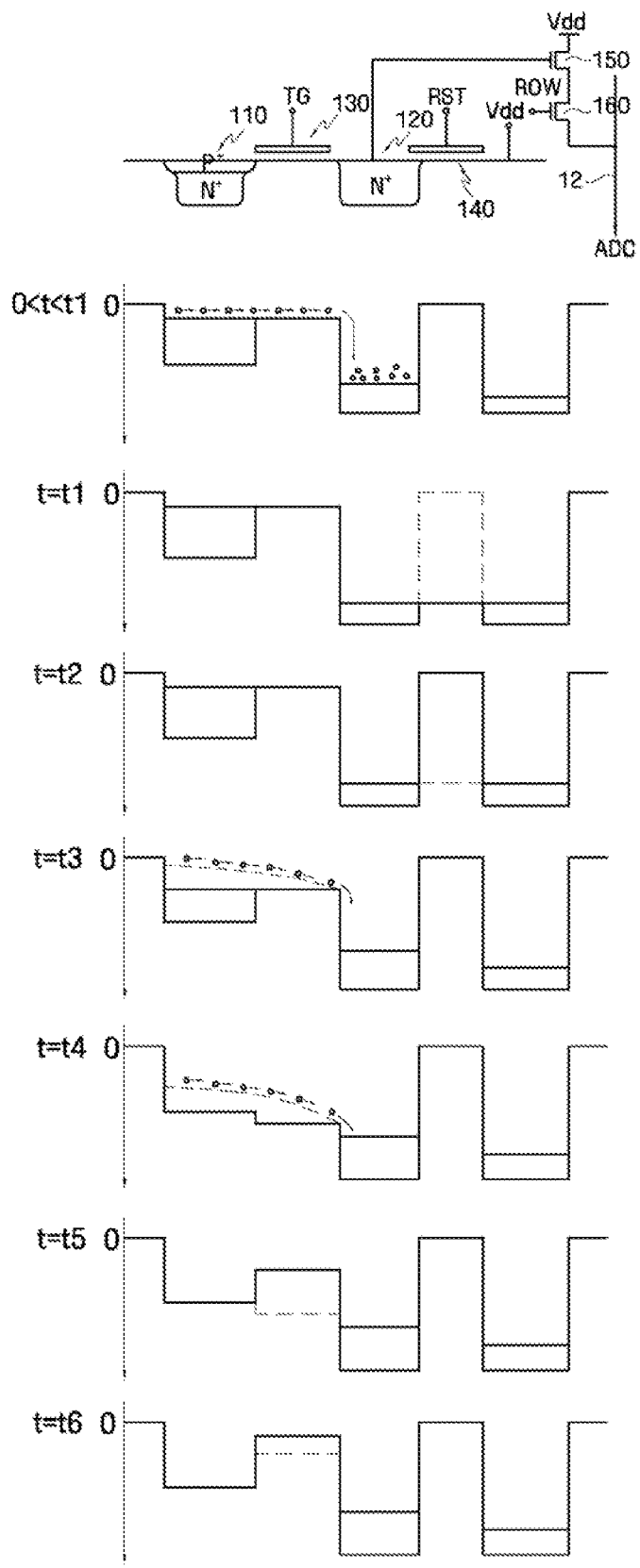
FIG. 11 is an exemplary schematic diagram and a related potential diagram of a CMOS image sensor according to an embodiment of the invention.

FIG. 10 is a timing diagram for a CMOS image sensor according to another embodiment of the invention. FIG. 11 is a related schematic diagram and electrical potential diagram for a CMOS image sensor, the operation of which is explained with reference to FIG. 10. In FIG. 11, a potential level before circuit operation is represented by a dotted line and a potential level after operation is represented by a solid line.

The operation of a CMOS image sensor like the examples illustrated in FIGS. 2 through 9 using, for example, a photoelectric conversion element, such as a photodiode will now be described in some additional detail with reference to FIGS. 10 and 11. Generally, all unit pixels arranged in the assumed pixel array unit commonly performs charge integration. A reset signal RST and a pixel selection signal ROW are common signals for unit pixels belonging to each row of the pixel array unit. That is, unit pixels belonging to one row are assumed to receive a specific reset signal and a specific pixel selection signal.

The assumed pixel array unit is composed of N rows, and the rows are sequentially represented by ROW(1), . . . , ROW(i), ROW(i+1), . . . , ROW(N). For convenience of illustration, the operation of an exemplary CMOS image sensor will be described only in terms of ROW(i) and ROW(i+1). As described above, the pixel selection signal ROW, the reset signal RST, and the charge transfer signal TG are supplied to the pixel array unit by the row driving unit controlled by a controller (not shown). The pixel array unit receives these several signals ROW, RST and TG, performs charge integration, and transfers the colleted charges to charge detection elements. The charge detection elements perform a sampling operation, such as a double sampling of a noise level and a signal level.

Referring to FIGS. 10 and 11, the period before t1 corresponds to a non-selected state for the subject pixel rows. That is, pixel selection signals ROW(i) and ROW(i+1), reset signals RST(i) and RST(i+1), charge transfer signals TG(i) and TG(i+1) are "low". However, since the teaching examples are assumed to comprise a depletion type transistor or an enhancement type transistor having a low threshold voltage (Vth) for the charge transfer element in order to prevent an overflow phenomenon that may be caused when an excessive amount of light energy is received by the photoelectric conversion element, even when the charge transfer element is inactivated, a channel is formed. Therefore, charge generated in quantity greater than a predetermined amount can be partially mobilized into the charge detection element via the charge transfer element.

At time (t1), when the pixel selection signal ROW(i) transitions to "high", the selection element is activated. That is, charge stored in the charge detection element is ready for a read out operation through a vertical signal line connected to a selected unit pixel. At time (t1), the reset signal RST(i) also transitions to "high" and the charge detection element is reset to Vdd. It should be understood that the reset signal RST(i) may transition to "high" after the transition of the pixel selection signal ROW(i) to "high".

At time (t2), the reset signal RST(i) transitions to "low". When the reset signal RST(i) transitions to "low", offset levels, i.e., noise levels, which are different for each pixel, are read out through the vertical signal line. Although not shown, noise levels of the vertical signal line are held in a correlated double sampler (see e.g., element 70 of FIG. 1) by, for example, a sample hold pulse.

At time (t3), when the charge transfer signal TG(i+1) transitions to "high," the charge transfer element is turned ON. In other words, accumulated charge is transferred from the photoelectric conversion element to the charge detection element. Since the charge detection element has a parasitic capacitance, charges are cumulatively collected. Therefore, the potential of the charge detection element is changed. Here, the period for which the charge transfer element is in an activated state is called the "transfer period".

Yet, conventionally, the charges accumulated on the photoelectric conversion element cannot completely be transferred to the charge detection element. The charges left on the photoelectric conversion element may appear as an afterimage during a subsequent reading operation, and may reduce charge integration capacity of the photoelectric conversion element.

Thus, at time (t4), the charge transfer signal TG(i) is converted to a boosted voltage signal higher than the externally provided power voltage (Vdd). By doing so, the potential applied to the charge transfer element is adjusted to be higher than that apparent at the photoelectric conversion element. Therefore, any residual charge on the photoelectric conversion element is completely transferred to the charge detection element.

At time (t5), the charge transfer signal TG(i) again transitions to "high." At time (t6), the charge transfer signal TG(i) transitions to "low." When the charge transfer signal TG(i) transitions to "low," a change in potential results at the charge detection element, i.e., a signal level is read out through the vertical signal line. Although not shown, the signal level of the vertical signal line 12 is held in the correlated double sampler 70 by, for example, a sample hold pulse.

That is to say, a noise level and a signal level are sequentially sampled by the single unit pixel 100, respectively. Of course, this exemplary sampling sequence may be reversed.

According to the above-described operation, output of a noise level and a signal level is controlled by a predetermined switch. Therefore, a fixed noise level is theoretically not generated even when the same channel is used. Furthermore, since a noise level and a signal level are sequentially output, a difference between the noise level and the signal level can be obtained by the correlated double sampler, or an analogous differential circuit, even when a separate memory is not used. This result simplifies the system design and operation.

Several subsequent processes may be performed up to the time at which image data is displayed or completely processed by a conventional image signal processing element (not shown). For example, the correlated double sampler may output a difference level between a noise level and a signal level. Therefore, a fixed noise level due to feature distribution of the unit pixel and the vertical signal line is prevented. Furthermore, a related analog-to-digital converter may receive an analog signal output from the correlated double sampler and output a corresponding digital signal.

Following time (t7), the charge transfer signal TG(i+1) transitions to "high." The foregoing operation may then be repeated for the i-th+1 row as it was performed for the i-th row. Prior to this point in time, (e.g., from time (t1) up to time (t7)), the state of non-selected pixel row TG(i+1) is characterized by a voltage lower than the voltage applied to selected pixel row TG(i).

Figure 12:
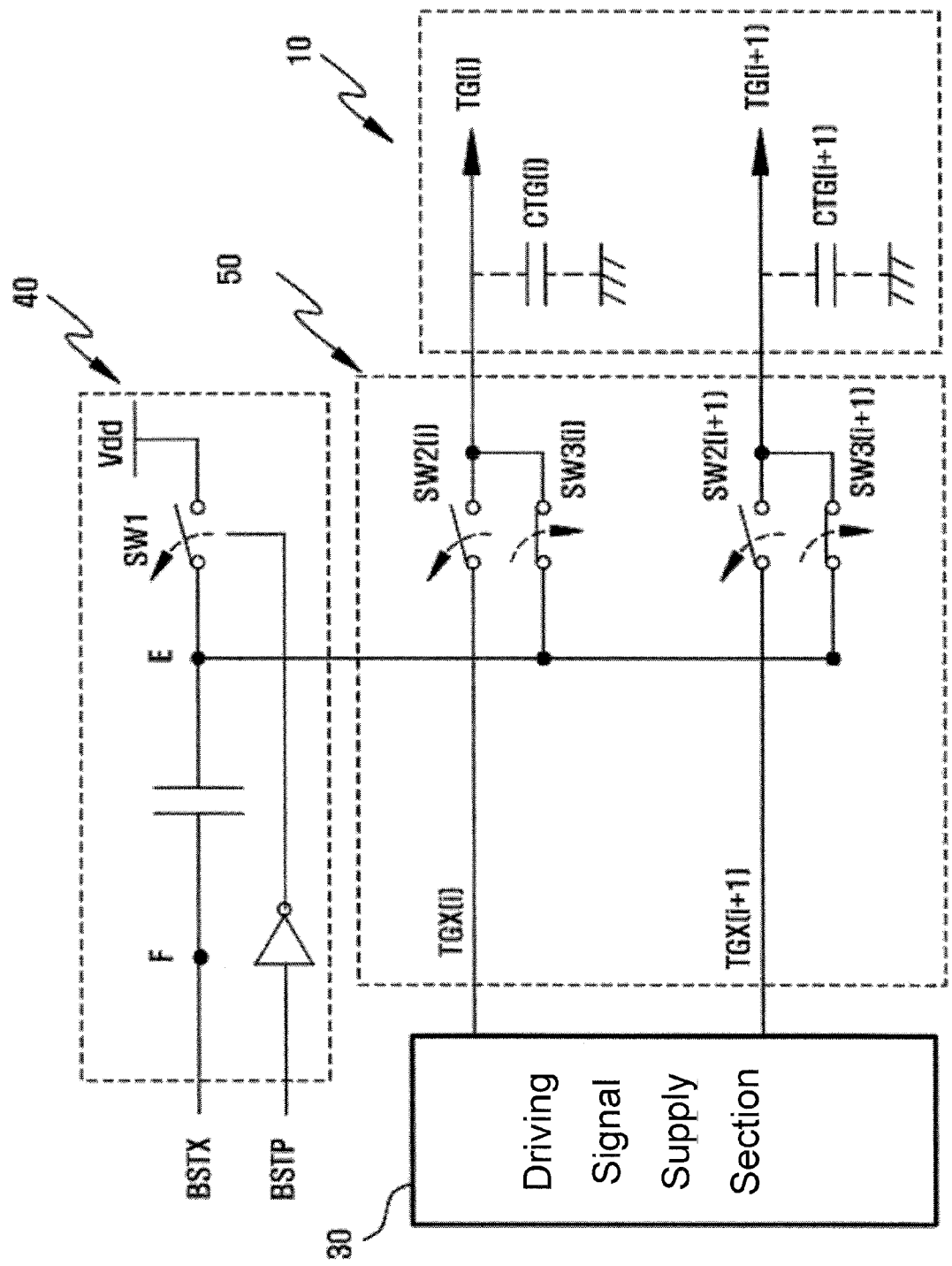
FIG. 12 is an exemplary circuit diagram illustrating a boosting section and a switching section of a CMOS image sensor according to another embodiment of the invention.

FIG. 12 is a circuit diagram illustrating a boosting section and a switching section of a CMOS image sensor according to yet another embodiment of the invention. The exemplary circuit illustrated in FIG. 12 is analogous in many ways to the circuit previously illustrated in FIG. 6. Thus, common elements between these two illustrated embodiments will be omitted.

The circuit of FIG. 12 essentially omits the gating logic (e.g., the dual AND gates) that selectively switches a voltage onto the respective charge transfer signal line(s) (e.g., TG). Rather, an inverted version of the pre-boosting signal (BSTP) is applied as a control signal to the first switch SW1. Operation of first switch SW1 in timed relationship to the boosting control signal (BSTX) and pre-boosting signal (BSTP) selectively apply the boosted voltage developed at node E to the respective charge transfer signal line(s). A single pull, double throw switch combination (SW2 and SW3) may be used in connection with first switch SW1 to switch between normally applied charge transfer processing signal TGX(i) and the boosted voltage signal.

Figure 13:
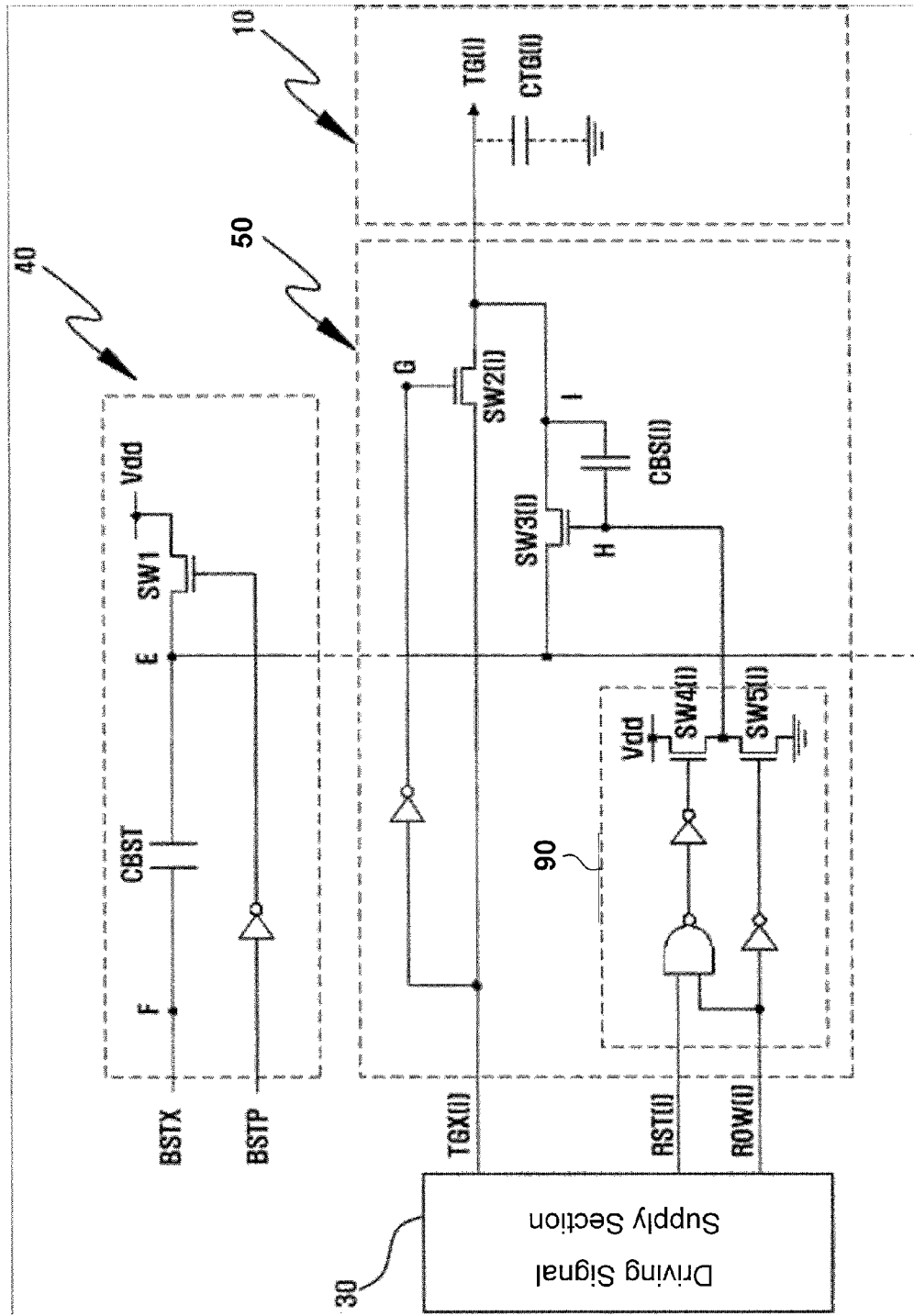
FIG. 13 is an exemplary circuit diagram illustrating a boosting section and a switching section of a CMOS image sensor according to yet another embodiment of the invention.
Figure 14:
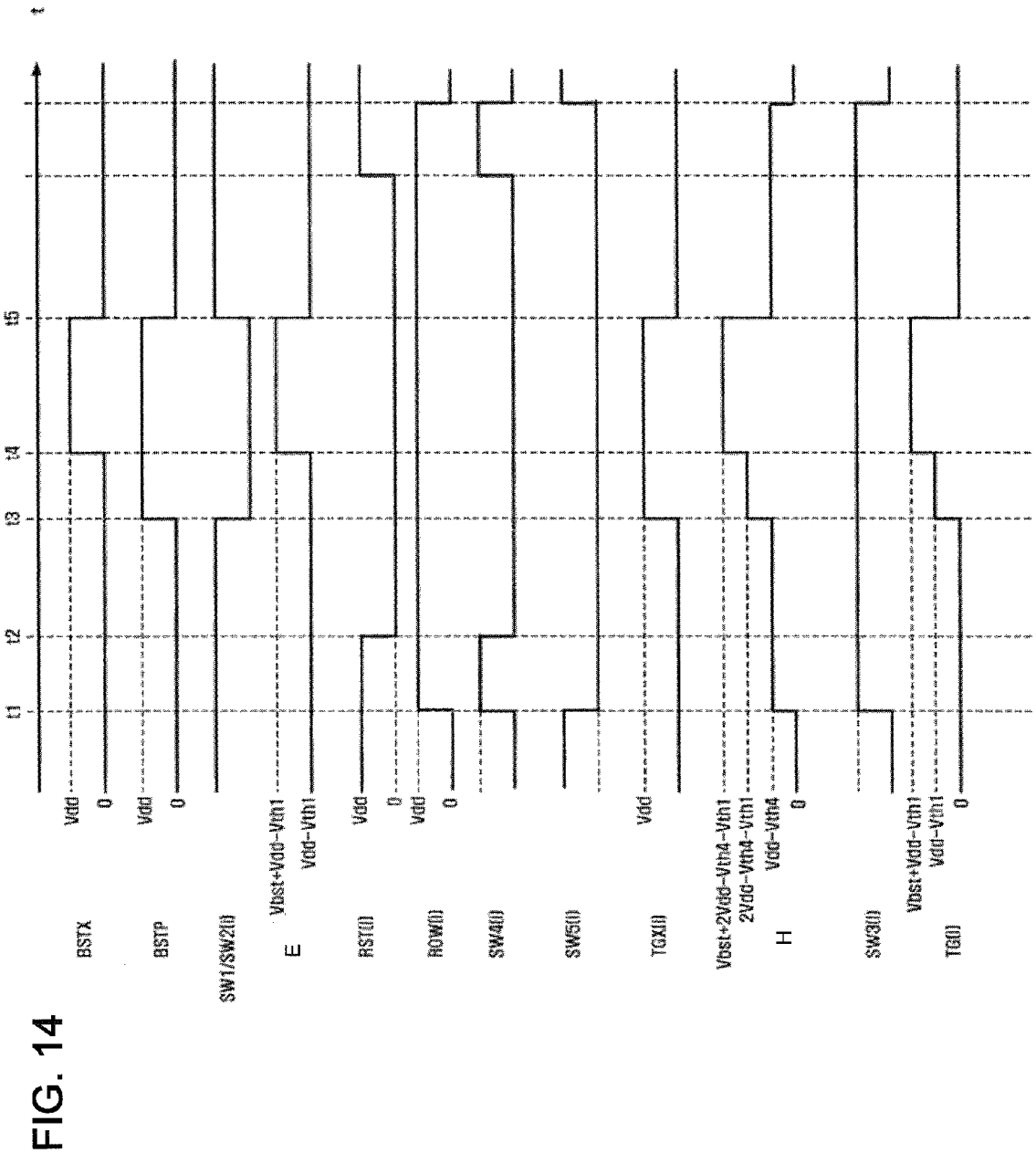
FIG. 14 is a timing diagram illustrating the operation of the exemplary CMOS image sensor illustrated in FIG. 13.

FIG. 13 is a circuit diagram illustrating a boosting section and a switching section of a CMOS image sensor according to yet another embodiment of the invention. The exemplary circuit illustrated in FIG. 13 is analogous in many ways to the circuit previously illustrated in FIG. 8. FIG. 14 is a timing diagram illustrating one exemplary relationship between signals apparent in the operation of the circuit illustrated in FIG. 13.

As between the circuits illustrated in FIGS. 8 and 13, switching section 50 in FIG. 13 has been altered in the following manner. First, a control block 90 is added to switching section 50. Control block 90 in the illustrated example comprises fourth and fifth switches (SW4 and SW5) connected between Vdd and ground. A control block output signal (e.g., the voltage apparent at node H) is tapped from the common connection of these to switching elements. The reset signal RST and row selection signal ROW are applied to an NAND gate, the inverted output of which is applied to the gate of the fourth switch SW4 as a control signal. An inverted version of the row selection signal is applied to the gate of the fifth switch SW5 as a control signal.

In view of the timed operation of the reset and row selection signals, the control block output signal is applied to the gate of a third switch SW3 and also charges boot strap capacitor CBS. Switching section 50 further comprises a second switch SW2 receiving the charge transfer processing signal TGX at its source and an inverted version of the charge transfer processing signal at its gate. The drains of the second and third switches, as well as one side of the boot strap capacitor CBS are commonly connected (node I) to the charge transfer signal line TG.

Exemplary operation of the circuit of FIG. 13 is illustrated in FIG. 14. At time t1, the row selection signal ROW transitions to "high", opening the fourth switch SW4, closing the fifth switch SW5, and opening the third switch SW3. As a result, a voltage potential of Vdd less the threshold voltage of the fourth switch SW4 (Vth4) is developed at node H. Thereafter, at time t2, the rest signal RST transitions to "low", closing the fourth switch SW4.

At time t3, the pre-boosting signal BSTP and charge transfer processing signal TGX transition to "high", thereby closing the first and second switches (SW1 and SW2). As a result, a voltage potential of twice Vdd less the threshold voltages of first and fourth switches (Vth1 and Vth4) is developed at node H, and a voltage potential of Vdd less the threshold voltage of the first switch (Vth1) is developed on the charge transfer signal TG.

At time t4, the boosting control signal BSTX transitions to "high", thereby boosting the voltage at node E to Vdd plus the boosting voltage Vbst, but less the threshold voltage of the first switch (Vth1). This boosted voltage causes the voltage potential at node H to rise to twice Vdd plus the boosting voltage Vbst, but less the threshold voltages of the first and fourth switches (Vth1 and Vth4), and the voltage apparent on the charge transfer signal line TG to rise to Vdd plus the boosting voltage Vbst, but less the threshold voltage of the first switch (Vth1).

At time t5, the boosting control signal BSTX, the pre-boosting signal BSTP, and charge transfer processing signal TGX, all transition to "low", returning the voltages apparent at node H and the charge transfer signal line TG to their respective un-boosted states.

Figure 15A:
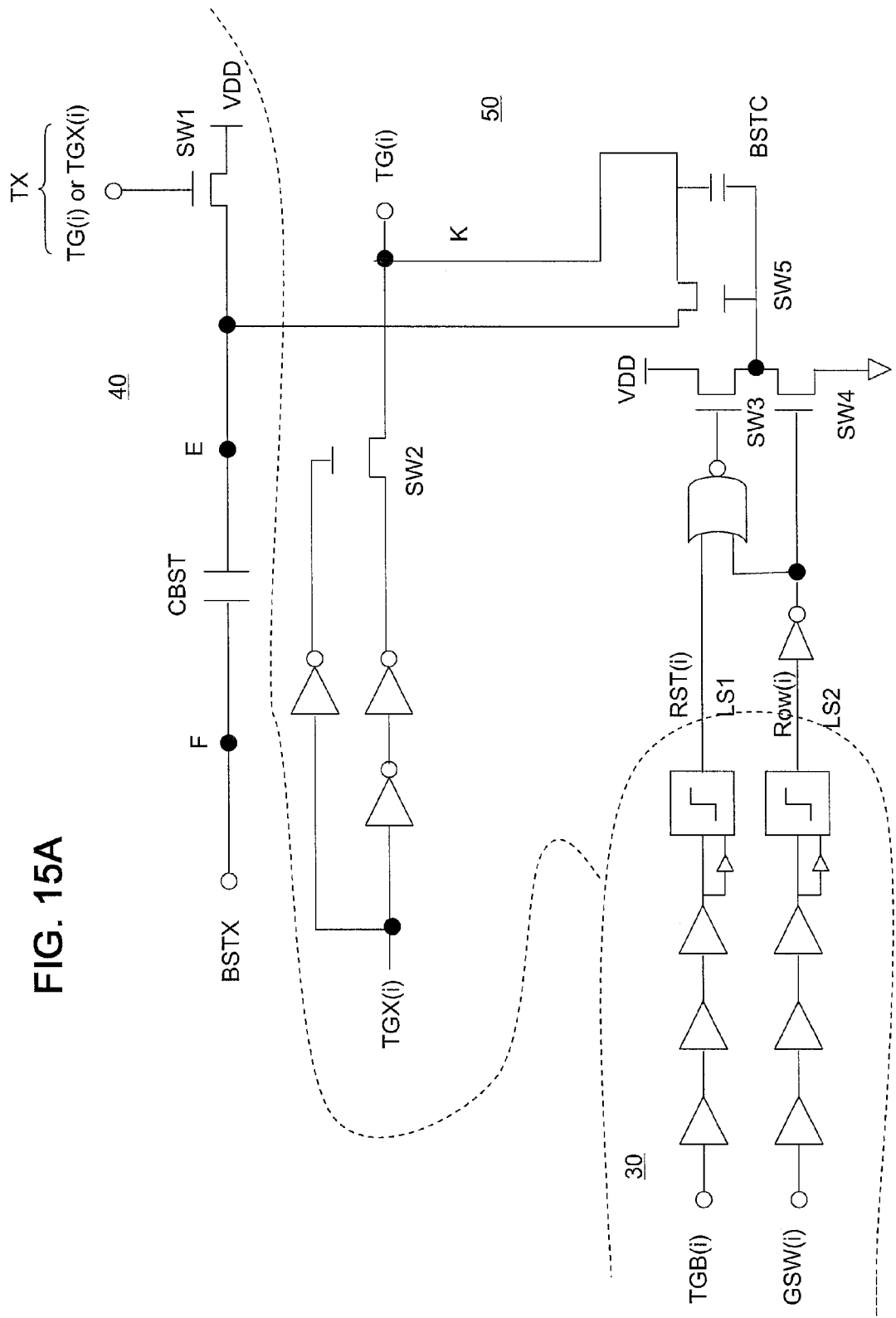
FIG. 15A is an exemplary circuit diagram illustrating a portion of a driving signal supply section, a boosting section, and a switching section of a CMOS image sensor according to yet another embodiment of the invention.
Figure 15C:
FIG. 15C is an output voltage waveform for the charge transfer signal for the exemplary CMOS image sensor illustrated in FIG. 15A.

FIGS. 15A, 15B and 15C are related drawings. FIG. 15A illustrates a boosting section 40, switching section 50, and part of a driving signal supply section 30 according to yet another embodiment of the present invention. Here, however, boosting section 40 comprises a boosting capacitor CBST connected between the boosting control signal BSTX and Vdd as switched by a first switch SW1 under the control of a transmission signal TX (e.g., either the charge transfer processing signal TGX or the charge transfer signal TG).

An exemplary portion of driving signal supply section 30 is also illustrated in FIG. 15A. This portion shows a circuit for generating pseudo versions of the reset signal RST and row selection signal ROW applied to the switching section 50 of a row driving unit. In the illustrated example, the reset signal RST is derived from a first master timing signal TGB provided by a master timing generator (not shown). Similarly, the row selection signal ROW is derived from a second master timing signal GSW provided by the master timing generator. In one particular embodiment, the first and second master timing signals are provided to driving signal supply section 30 with a "high" nominal voltage level of around 1.5V. Thus, each of the master timing signals is applied through a respective delay timing chain to a level shifter (LS1 and LS2). The reset and row selection signals emerge from the level shifters with appropriate delay characteristics and an increased "high" nominal voltage of around 2.5V, and are applied to switching section 50.

In switching section 50, an inverted version of the row selection signal is applied to the gate of a fourth switch SW4 and the input of a NAND gate which also receives the rest signal. The NANDed output of the rests signal and inverted row selection signal is applied to the gate of a third switch SW3. The third and fourth switches (SW3 and SW4) are connected between Vdd and ground. A tapped output of this switch combination is applied to the gate of a fifth switch SW5 and also charges a first side of boot strap capacitor BSTC.

Switching section 50 further comprises a second switch SW2 controlling the charge transfer signal line TG voltage, and being gated by an inverted version of the charge transfer processing signal TGX. The fifth switch SW5 is connected between node E, as described above in relation to the operation of boosting circuit 40, and a second side of boot strap capacitor, as it is connected to the output of the charge transfer signal line TG.

Operation of the exemplary circuit illustrated in FIG. 15A may be better understood in relation to the timing diagram of the applied input signals (BSTX, TX, TGB and GSW) shown in FIG. 15B and the graph of the resulting output voltage apparent at charge transfer signal line TG shown in FIG. 15C.

The operation of this embodiment follows the dictates of the previously explained examples, and those of ordinary skill in the art will readily follow the actuation of the constituent switches under the timed operation of the input switching signals to generate a boosted voltage at the output node K of the charge transfer signal line TG. Of further note, this boosted output voltage, like that provided by the previous examples, may be sized by selection of the boosting capacitor value.

Many contemporary CMOS imagers include a shutter function that allows a host system operator to control the charge integration time associated with the photo-conversion element (e.g., photodiode) of each pixel element. The shutter function is analogous to the exposure setting on older film cameras, for example. In order to be of maximum benefit, the control signal(s) implementing the shutter function should be specifically and selectively applicable to individual pixels. This being the case, application of a shutter enable signal to the respective rows and/or pixels of a CMOS imager should have no adverse effect on the group voltage boosting of the charge transfer signal(s).

Embodiments of the invention are applicable to CMOS imagers having a shutter function and are able to accommodate the selective application of a shutter enable signal to the pixel array unit without collapsing the voltage boosting function described above. Consider for example the circuit embodiment illustrated in FIG. 16 in which a control block 90 is modified to accept a shutter enable signal logically ORed with the row selection signal ROW.

Figure 16:
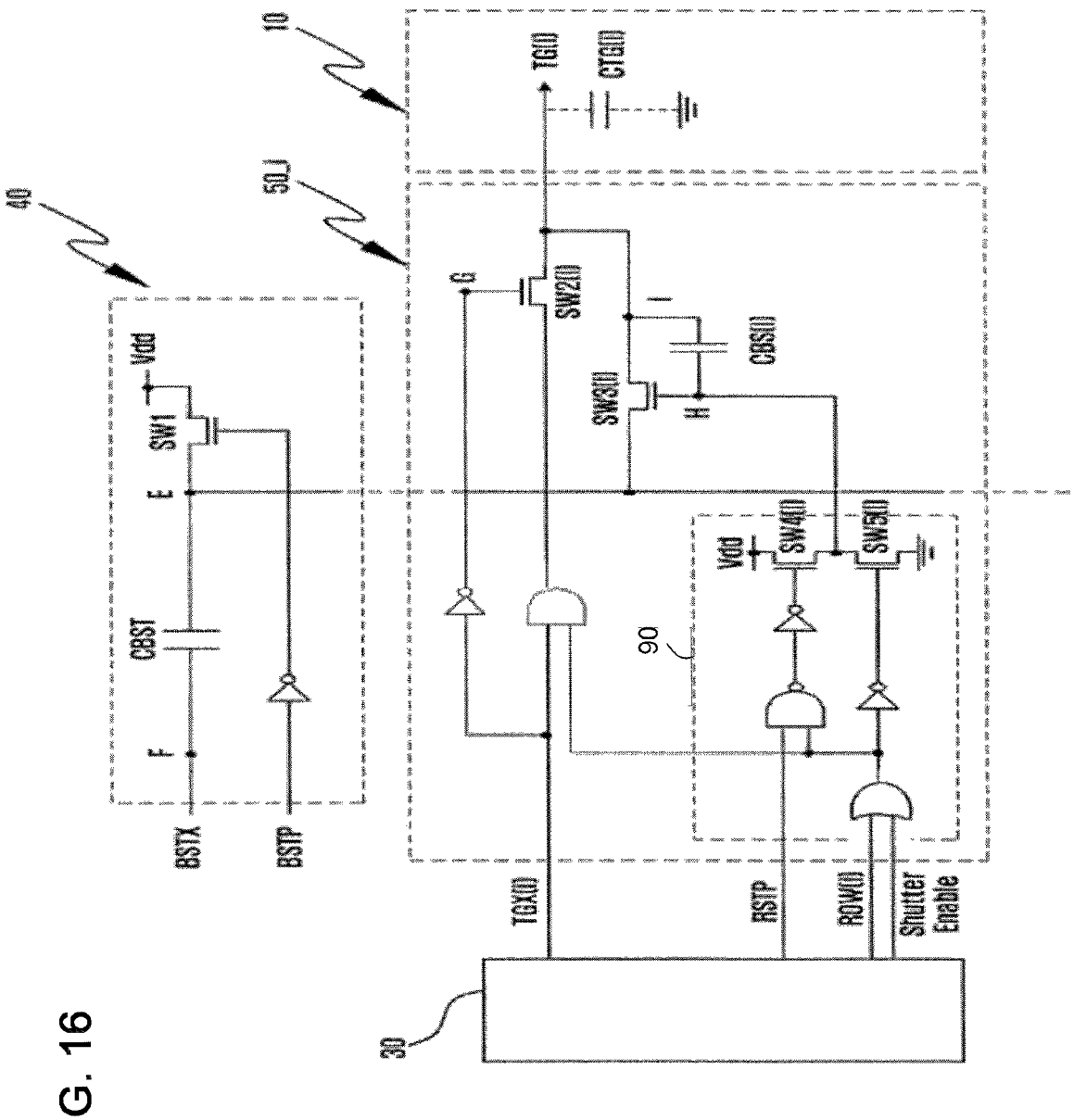
FIG. 16 is an exemplary circuit diagram illustrating a boosting section and a switching section of a CMOS image sensor according to yet another embodiment of the invention.
Figure 17:
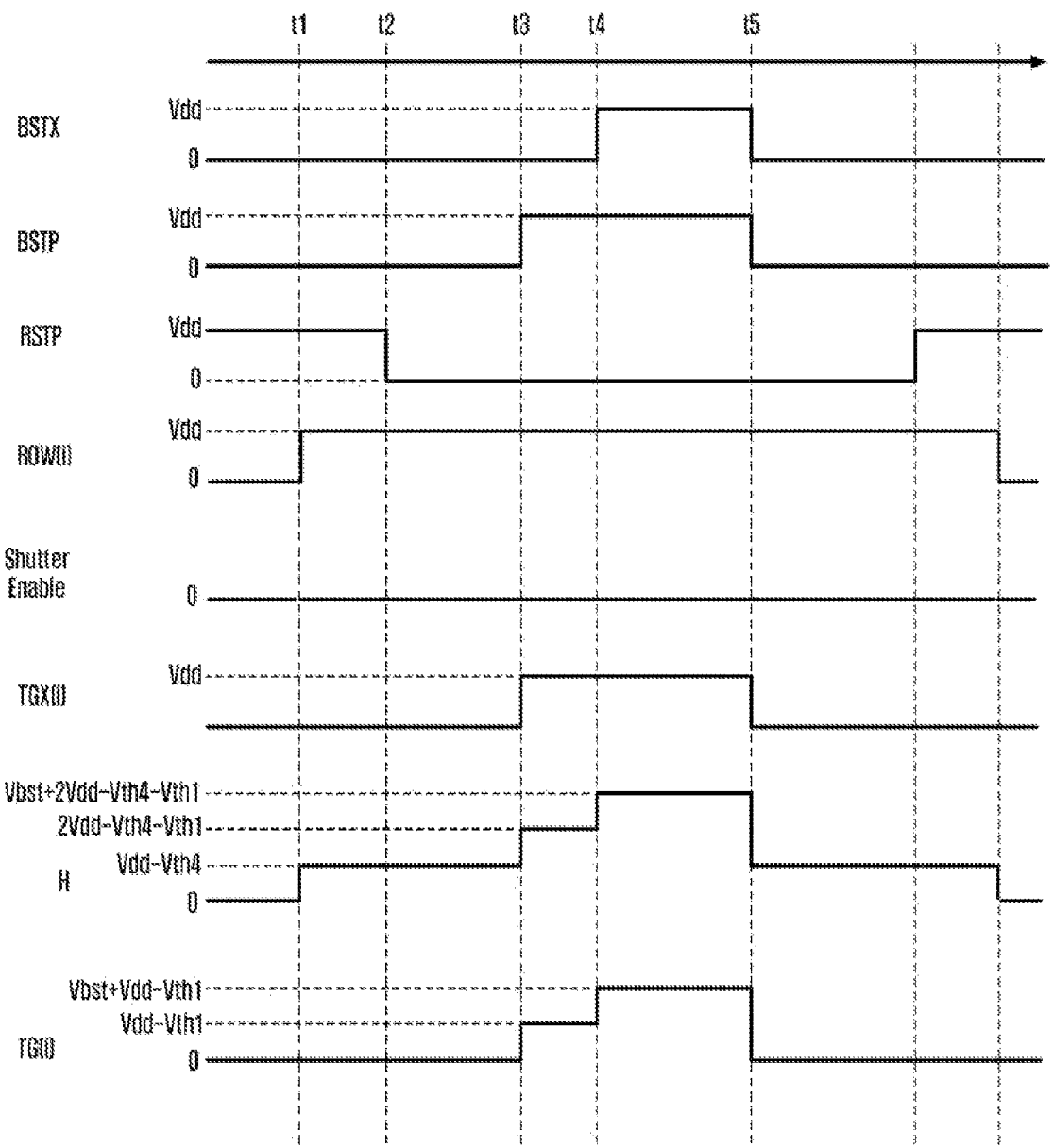
FIGS. 17 and 18 are timing diagrams illustrating the respective operations of the exemplary CMOS image sensor illustrated in FIG. 16; and, FIGS. 19 through 22 are exemplary block diagrams illustrating various architectures for boosting section(s) and switching section(s), as well as selected signal connections, of a CMOS image sensor according to several additional embodiments of the invention.
Figure 18:
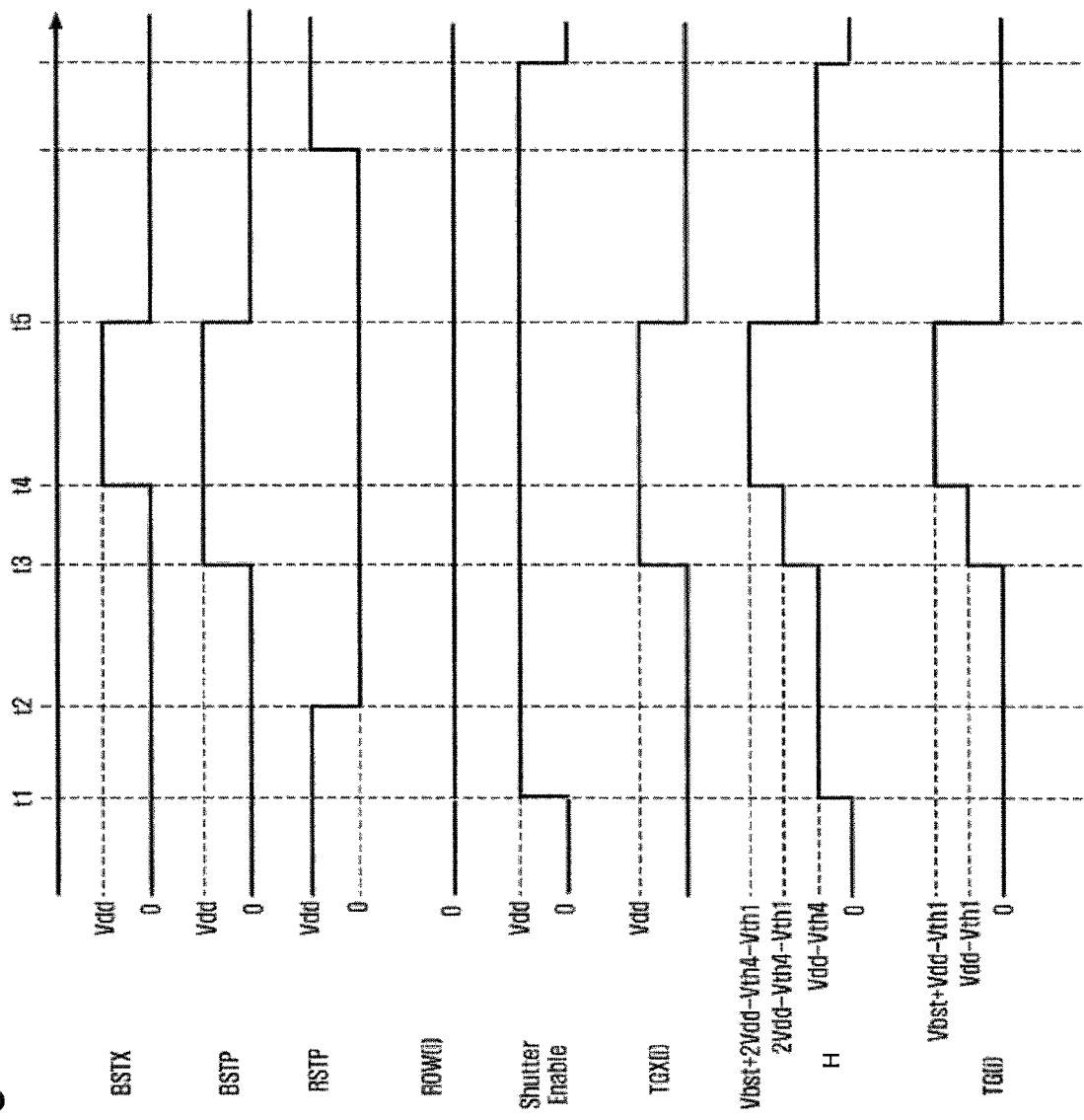

The functional aspects of the circuit shown in FIG. 16 are otherwise analogous to those of the exemplary circuit shown in FIG. 13. Yet as may be seen from a comparison of the timing diagrams shown in FIGS. 17 and 18, there is no adverse effect as between non-selection of the electronic shutter function (e.g., shutter enable "high" in FIG. 17), and selection of the electronic shutter function (e.g., shutter enable "low" in FIG. 18).

The exemplary circuit diagrams contained FIGS. 19 through 22 illustrate various architectures or arrangements as between driving signal supply section 30, boosting section(s) 40, switching section(s) 50, pixel array unit 10, and related control signals.

Figure 19:
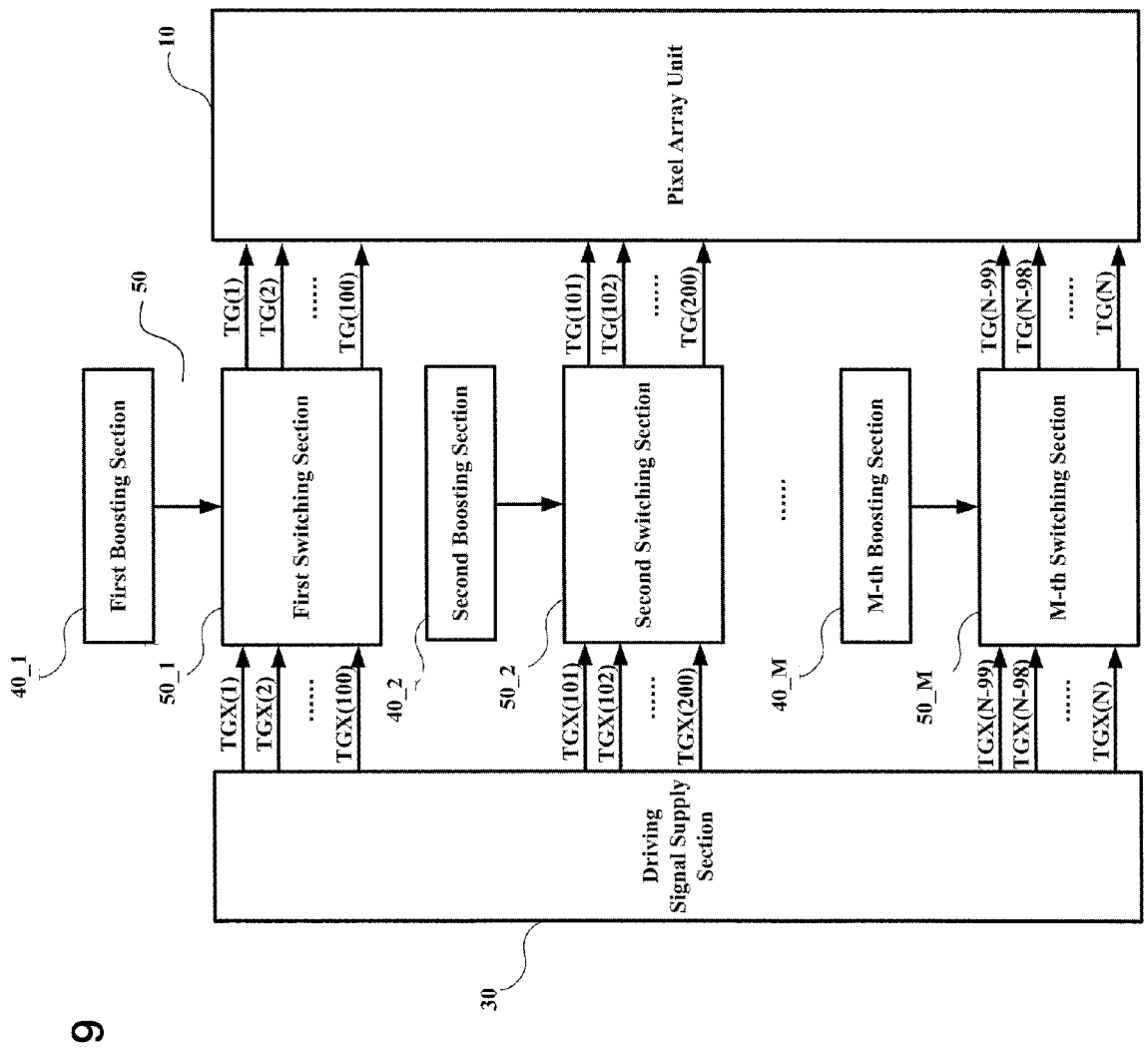

Referring to FIG. 19, the exemplary CMOS image sensor comprises a plurality of boosting sections 40_1, 40_2, . . . , 40_M, and a corresponding plurality of switching sections 50_1, 50_2, . . . , 50_M. In the illustrated example, each boosting section and switching section correspond to a block of one hundred pixel rows in pixel array unit 10. This is merely one example of many similar distinctions that may be made in the design of a CMOS image sensor implemented in accordance with embodiments of the invention. However, by defining the architecture of the row driving unit in such a manner that the array of pixel rows are grouped into smaller blocks, and the smaller blocks are then actuated by corresponding combinations of a boosting section and a switching section, the bulk (i.e., capacitive loading) parasitic effect of the many row lines forming the pixel array unit may be mitigated.

Figure 20:
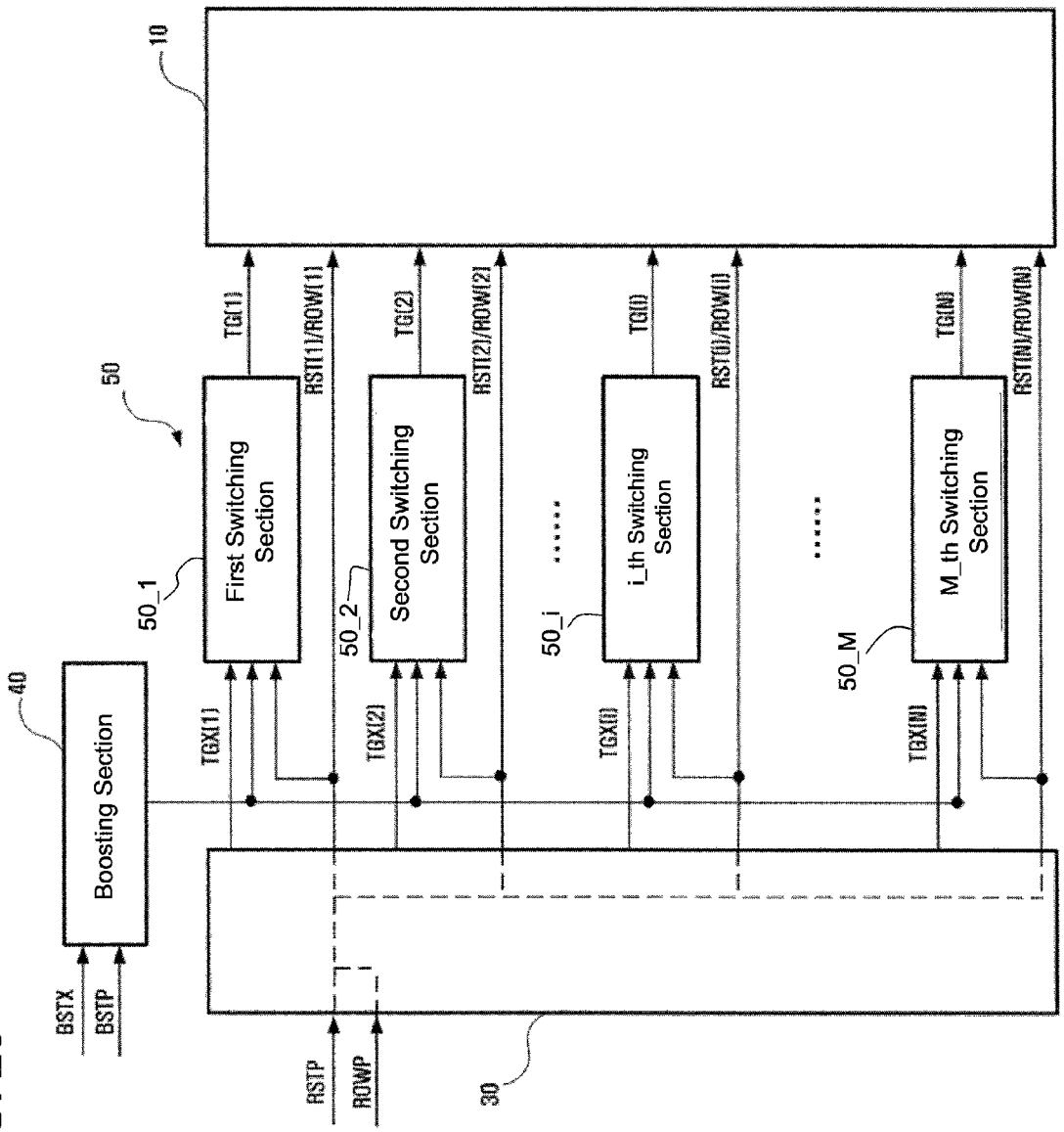

In contrast, the architecture illustrated in FIG. 20 uses only a single boosting section 40 to provide boosting voltages to a plurality of switching sections 50_1, 50_2, . . . , 50_M. Additionally, this embodiment illustrates one possible flow and connection of the reset, row selection, charge transfer processing, and charge transfer signals across the row driving unit.

Figure 21:
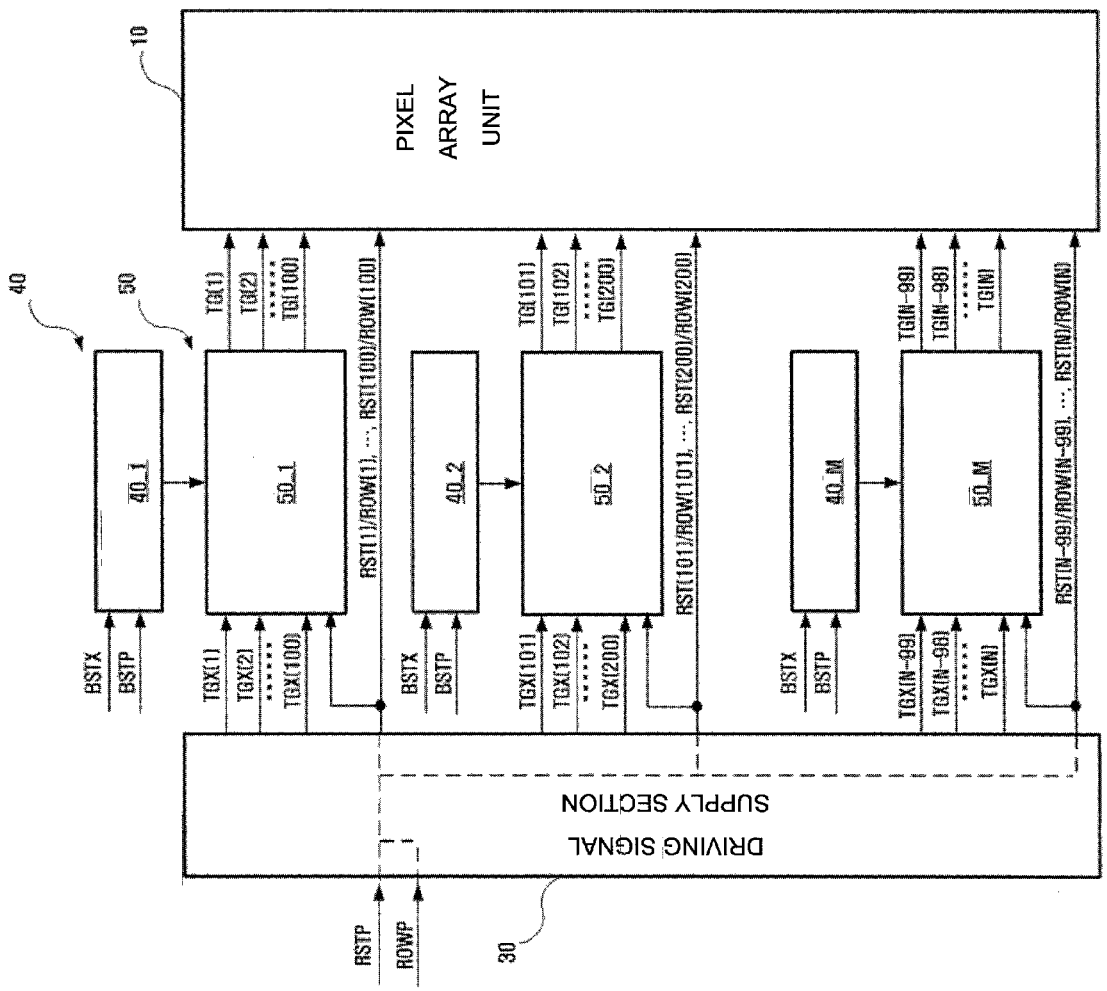
Figure 22:
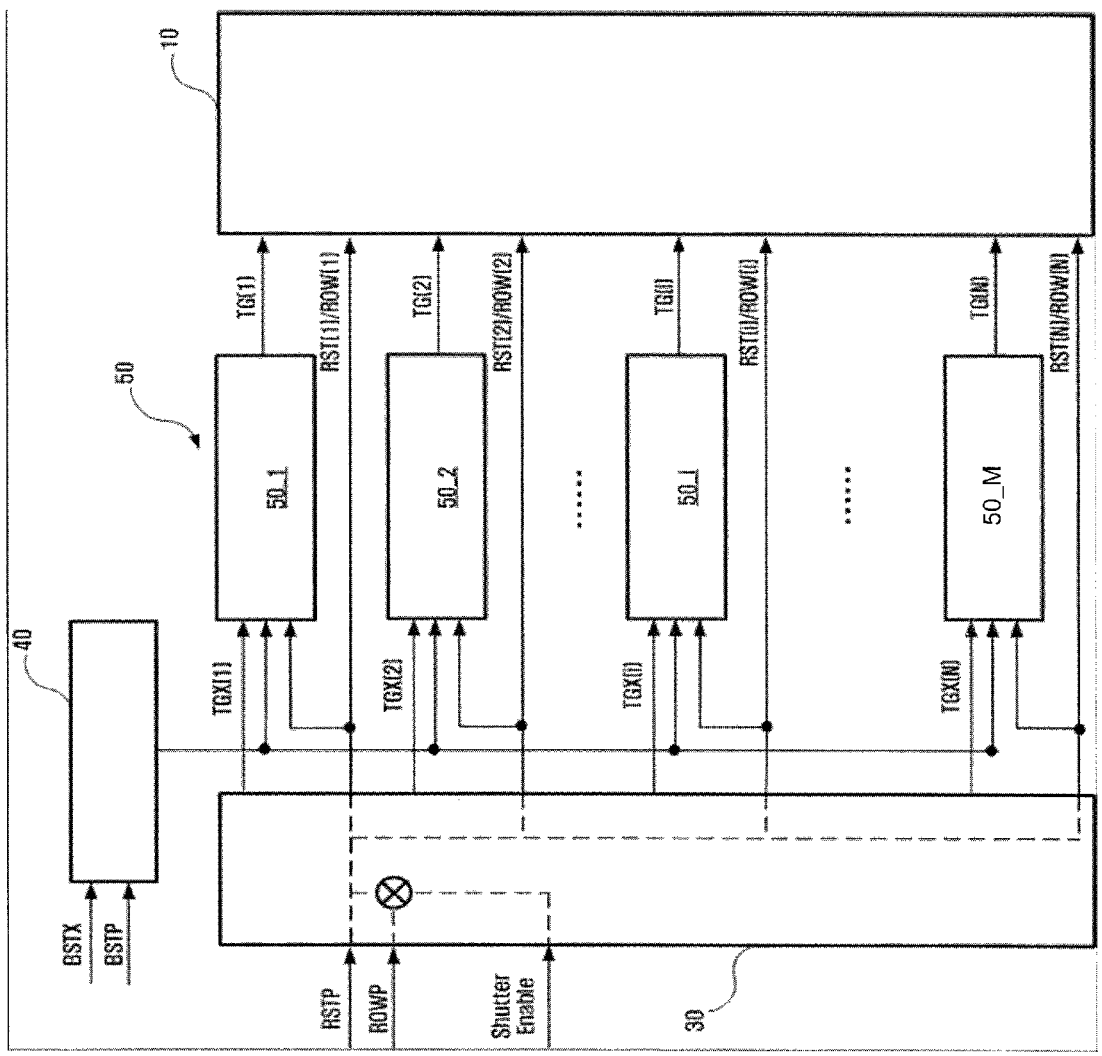

In further contrast, the architecture illustrated in FIG. 21 resumes the assumption of separate corresponding pluralities of boosting sections 40_1, 40_2, . . . , 40_M, and switching sections 50_1, 50_2, . . . , 50_M, and their connection to respective groups of pixel row lines. Additionally, this embodiment illustrates another possible flow and connection of the reset, row selection, charge transfer processing, and charge transfer signals across the row driving unit. Naturally, the connection and flow of control signals will be determined in large measure by the constituent circuits forming the respective boosting and switching sections. In other words, as illustrated above in some detail, different embodiments of the boosting section and/or switching section may be used to effectively generate the desired boosting charge transfer signal. These different embodiments may generate these signals using various control signals normally apparent in the CMOS imager for other reasons. Thus, the system designer's choice of circuitry will determine the layout and application of control signaling to the boosting and switching sections of the various embodiments.

In yet further contrast, the architecture illustrated in FIG. 22 again assumes only a single boosting section 40 to provide boosting voltages to a plurality of switching sections 50_1, 50_2, . . . , 50_M. However, the provision of a shutter enable signal to driving signal supply section 30 is illustrated along with another possible flow and connection of the reset, row selection, charge transfer processing, and charge transfer signals across the row driving unit.

Although the foregoing description of exemplary circuit embodiments and their operation, for simplicity, has been uniformly given with respect to an assumed pixel independent read mode in which signals for all of the unit pixels are independently read, the present invention is not limited to only this mode operation. Rather, those of ordinary skill in the art will understand that embodiments of the invention may be effectively used to implement all of the conventionally understood modes of operation for CMOS imagers.

Further, while an exemplary unit pixel for the various embodiments of a CMOS image sensor has been assumed to use negative charge carriers and NMOS transistor(s), the invention is not limited to this design choice. A unit pixel might be designed and implemented using positive charge carriers and PMOS transistor(s). A change in operating voltage polarity will result accordingly.

Those of ordinary skill in the art will similarly recognize that embodiments of the CMOS image sensor designed in accordance with the dictates of the invention may include additional signal processing hardware, focusing lens and/or light filtering element(s). Embodiments of the CMOS image sensor are well adapted to integration within a single module within an electrical apparatus.

Embodiments of the CMOS image sensor provided by the invention enjoy numerous advantages. For example, the boosted voltage signal supplied to the charge transfer element during the charge transfer period facilitates complete charge transfer from the photoelectric conversion element to a charge detection element. Thus, potential afterimage effects are reduced or eliminated. The conversion gain and charge integration capacity of the photoelectric conversion element may thus be enhanced. The resulting image sensor designs need not be resistant to high voltages.

Other advantages will become apparent in the many design variations and modifications readily suggested by the exemplary embodiments. Such variations and modifications fall within the scope of the invention as defined by the attached claims.

What is claimed is:

1. A method of operating a CMOS image sensor, the CMOS image sensor comprising a row-by-column pixel array of unit pixels receiving an externally provided power voltage, each unit pixel comprising a photoelectric conversion element, a charge detection element and a charge transfer element, the method comprising:

collecting charge in the photoelectric conversion element and transferring the collected charge to the charge detection element via the charge transfer element during a charge transfer period; and generating a boosted voltage signal having a voltage greater than the power voltage only during a voltage boosting portion of the charge transfer period and supplying the boosted voltage signal to the charge transfer element during the voltage boosting portion of the charge transfer period, wherein the voltage boosting portion of the charge transfer period is less than the charge transfer period.

2. The method of claim 1, wherein the CMOS image sensor further comprises a driving signal supply section providing a charge transfer processing signal, a boosting section providing the boosted voltage signal, and a switching section, the method further comprising:

by operation of the switching section, providing either the charge transfer processing signal or the boosted voltage signal to the charge transfer element.

3. The method of claim 2, wherein the boosting section further comprises a boosting capacitor and a switch controlling application of the power voltage to the boosting capacitor, and the method further comprises:

receiving a boosting control signal and a pre-boosting signal in the boosting section and defining the voltage boosting portion of the charge transfer period in relation to the boosting control and pre-boosting signals.

4. The method of claim 2, wherein the driving signal supply section further provides a reset signal and a row selection signal related to at least one pixel row in the pixel array, and the method further comprises:

defining the charge transfer period in relation to the reset and row selection signals.

5. The method of claim 3, further comprising:

developing charge on the boosting capacitor in accordance with timed operation of the switch as controlled by the pre-boosting signal;

wherein the boosted voltage signal is defined, at least in part, in relation to the developed charge on the boosting capacitor.

6. A method of operating a CMOS image sensor, the CMOS image sensor comprising a row-by-column pixel array of unit pixels receiving an externally provided power voltage, each unit pixel comprising a photoelectric conversion element, a charge detection element and a charge transfer element, the method comprising:

transferring charge from the photoelectric conversion element to the charge detection element via the charge transfer element in accordance with a charge transfer signal applied to the charge transfer element via a charge transfer signal line;

generating a boosted voltage signal having a voltage greater than the power voltage only during a portion of a charge transfer period, the portion of the charge transfer period being shorter than the charge transfer period; and selectively switching the boosted voltage signal and a charge transfer processing onto the charge transfer signal line only as the charge transfer signal during the charge transfer period.

7. The method of claim 6, wherein the CMOS image sensor further comprises a driving signal supply section providing the charge transfer processing signal, a boosting section providing the boosted voltage signal, and a switching section, and the method further comprises:

by operation of the switching section, switching either the charge transfer processing signal or the boosted voltage signal onto the charge transfer signal line.

8. The method of claim 7, wherein the boosting section further comprises a boosting capacitor and a switch controlling application of the power voltage to the boosting capacitor, and the method further comprises:

receiving a boosting control signal and a pre-boosting signal in the boosting section and switching the boosted voltage signal onto the charge transfer signal line in relation to the boosting control and pre-boosting signals.

9. The method of claim 7, wherein the driving signal supply section further provides a reset signal and a row selection signal related to at least one pixel row in the pixel array, and the method further comprises:

switching the boosted voltage signal onto the charge transfer signal line in relation to the reset and row selection signals.

10. The method of claim 8, further comprising:

developing charge on the boosting capacitor in accordance with timed operation of the switch as controlled by the pre-boosting signal;

wherein the boosted voltage signal is defined, at least in part, in relation to the developed charge on the boosting capacitor.

11. A method of transferring charge developed on a photoelectric conversion element receiving a power voltage to a charge detection element via a charge transfer element in a CMOS image sensor, comprising:

defining a boosting capacitance;

defining a loading capacitance associated with the charge transfer element;

dividing charge between the boosting capacitance and the loading capacitance to generate a boosted voltage signal higher than the power voltage during a boosting portion of a charge transfer period less than the charge transfer period; and switchably applying the boosted voltage signal to the charge transfer element only during the boosting portion of the charge transfer period.

12. The method of claim 11, further comprising:

providing a charge transfer processing signal and defining the charge transfer period in relation to the charge transfer processing signal.

13. The method of claim 11, wherein applying the boosted voltage signal to the charge transfer element comprises:

selecting a one unit pixel row from a plurality of unit pixel rows in a pixel array unit; and switching the boosted voltage signal onto a charge transfer signal line connected to the charge transfer element.

14. The method of claim 11, wherein defining the loading capacitance comprises providing a boot strap capacitor.

15. The method of claim 12, further comprising:

additionally providing a boosting control signal and a pre-boosting signal and further defining the boosting portion of the charge transfer period in relation to the boosting control and pre-boosting signals.

16. The method of claim 12, further comprising:

additionally providing a reset signal and a row selection signal, and further defining the charge transfer period in relation to the reset and row selection signals.

17. The method of claim 16, further comprising:

additionally providing a shutter enable signal, and further defining the charge transfer period in relation to the shutter enable signal.

* * * * *